United States Patent
Kaneko et al.

(10) Patent No.: US 9,035,360 B2
(45) Date of Patent: May 19, 2015

(54) SEMICONDUCTOR DEVICE AND SIP DEVICE USING THE SAME

(75) Inventors: Kishou Kaneko, Kanagawa (JP); Naoya Inoue, Kanagawa (JP); Yoshihiro Hayashi, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 87 days.

(21) Appl. No.: 13/610,241

(22) Filed: Sep. 11, 2012

(65) Prior Publication Data

US 2013/0082765 A1    Apr. 4, 2013

(30) Foreign Application Priority Data

Sep. 29, 2011    (JP) .................................. 2011-213918

(51) Int. Cl.
*H01L 23/52*    (2006.01)
*H01L 27/06*    (2006.01)
*H01L 21/822*    (2006.01)

(52) U.S. Cl.
CPC ........ *H01L 27/0688* (2013.01); *H01L 21/8221* (2013.01); *H01L 2224/48091* (2013.01); *H01L 2224/48137* (2013.01); *H01L 2224/48247* (2013.01)

(58) Field of Classification Search
USPC ........... 257/207, 208, 209, 210, 211, E27.108
See application file for complete search history.

(56) References Cited

U.S. PATENT DOCUMENTS

| 5,043,788 | A |   | 8/1991 | Omoto et al. |
| 5,519,234 | A | * | 5/1996 | Paz de Araujo et al. ...... 257/295 |
| 5,920,089 | A | * | 7/1999 | Kanazawa et al. ............ 257/202 |
| 5,936,280 | A | * | 8/1999 | Liu ............................... 257/347 |
| 7,268,611 | B2 |   | 9/2007 | Kikuchi et al. |
| 7,413,987 | B2 | * | 8/2008 | Hieda et al. ................... 438/691 |
| 7,626,257 | B2 | * | 12/2009 | Knorr ........................... 257/698 |
| 7,842,967 | B2 | * | 11/2010 | Ohtsuka et al. ............... 257/121 |
| 7,888,732 | B2 | * | 2/2011 | Denison et al. ............... 257/328 |
| 7,929,321 | B2 | * | 4/2011 | Hshieh ............................ 363/25 |
| 8,169,081 | B1 | * | 5/2012 | Jergovic et al. ............... 257/773 |
| 8,237,162 | B2 |   | 8/2012 | Arai |

(Continued)

FOREIGN PATENT DOCUMENTS

| JP | 02138756 | 5/1990 |
| JP | 10268254 | 10/1998 |

(Continued)

OTHER PUBLICATIONS

Japanese Office Action, dated Feb. 17, 2015, in corresponding Japanese Patent Application No. 2011-213918.

*Primary Examiner* — Eva Y Montalvo
*Assistant Examiner* — Samuel Lair
(74) *Attorney, Agent, or Firm* — Young & Thompson

(57) ABSTRACT

A semiconductor device includes a logic circuit and an active element circuit. The logic circuit is provided with semiconductor elements formed in a semiconductor substrate. The active element circuit is provided with transistors formed using semiconductor layers formed over a diffusion insulating film formed above a semiconductor substrate. The active element circuit is controlled by the logic circuit.

19 Claims, 26 Drawing Sheets

(56) References Cited

U.S. PATENT DOCUMENTS

| | | | |
|---|---|---|---|
| 8,426,862 B2 | 4/2013 | Arai | |
| 8,467,825 B2 | 6/2013 | Kato et al. | |
| 8,779,594 B2 * | 7/2014 | Inoue et al. | 257/758 |
| 8,892,158 B2 | 11/2014 | Kato et al. | |
| 2006/0170046 A1 * | 8/2006 | Hara | 257/347 |
| 2009/0085541 A1 * | 4/2009 | Jang | 323/282 |
| 2010/0148171 A1 * | 6/2010 | Hayashi et al. | 257/43 |
| 2010/0259201 A1 * | 10/2010 | Kawano et al. | 315/362 |
| 2011/0133274 A1 * | 6/2011 | You et al. | 257/336 |
| 2012/0063209 A1 | 3/2012 | Koyama et al. | |

FOREIGN PATENT DOCUMENTS

| | | |
|---|---|---|
| JP | 2000357775 | 12/2000 |
| JP | 2005183611 | 7/2005 |
| JP | 2007-157932 | 6/2007 |
| JP | 2010114213 | 5/2010 |
| JP | 2010-141230 | 6/2010 |
| JP | 2010141244 | 6/2010 |
| JP | 2011129891 | 6/2011 |
| JP | 2012256822 | 12/2012 |
| WO | 2004025730 | 3/2004 |

* cited by examiner

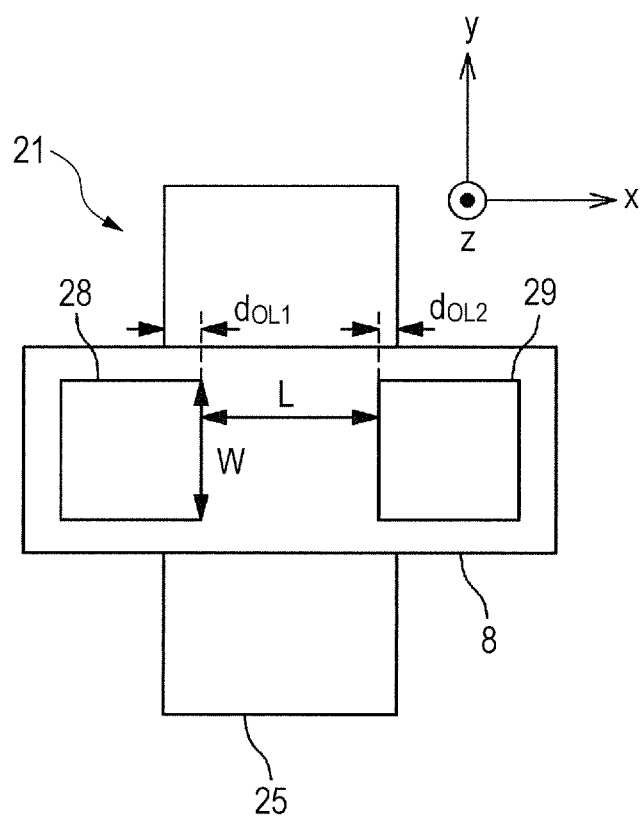

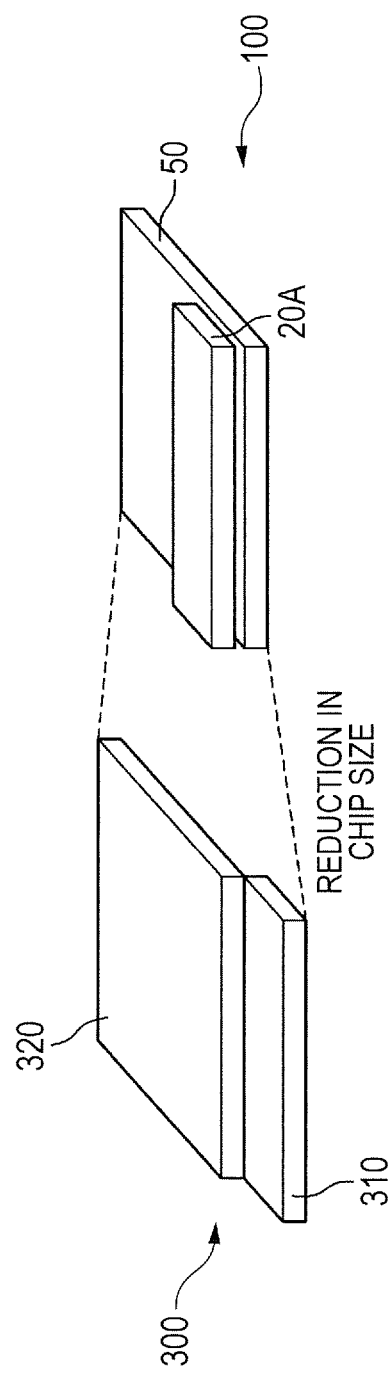

FIG. 15B
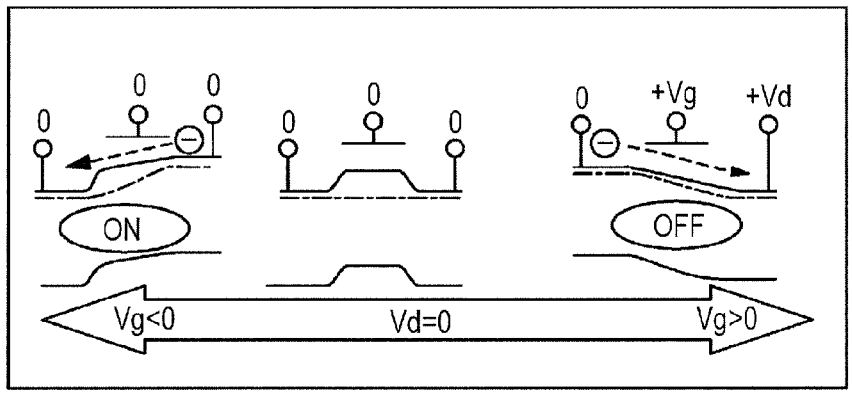
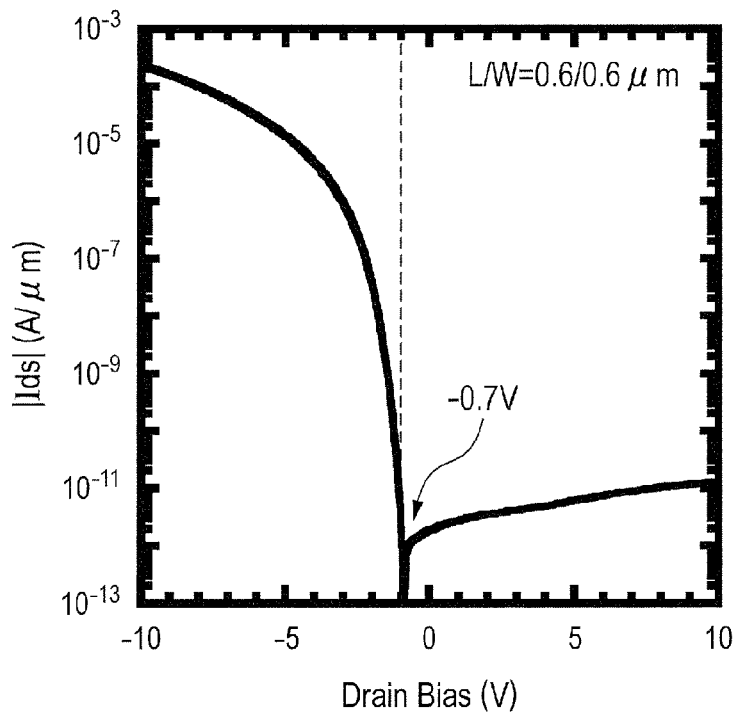

SEMICONDUCTOR DEVICE AND SIP DEVICE USING THE SAME

CROSS-REFERENCE TO RELATED APPLICATIONS

The disclosure of Japanese Patent Application No. 2011-213918 filed on Sep. 29, 2011 including the specification, drawings and abstract is incorporated herein by reference in its entirety.

BACKGROUND

The present invention relates to a semiconductor device and a SiP (system in package) using the same. The present invention relates particularly to a semiconductor device having an active element circuit including high breakdown active elements, and a logic circuit operated at a low voltage, both of which are integrated into the same LSI (large scale integrated circuit) chip.

A CMOS-LSI (complementary metal oxide semiconductor LSI) device brings about an improvement in performance and a reduction in power consumption by a scale-down technology. As to the power consumption in particular, the effect of reducing a power supply voltage by scaling is extremely large. LSIs for automobile use, household electrical appliances and industrial applications, however, often need a high power supply voltage used in an interface circuit to the outside. There has been a demand for a high breakdown active element unbroken even by a high power supply voltage, a function for adjusting a difference in power supply voltage between an externally-driven device and an element, and a function for generating a high terminal voltage by a switching operation in an LSI operated at a low power supply voltage. It is general that as the high breakdown active element, an LDMOS (Laterally Diffused MOS) is used to enhance a drain breakdown voltage, or a MOS transistor high in gate breakdown voltage (or thick in gate insulating film thickness) is used. A DC-DC converter is commonly used for voltage adjustments at the time that an external interface circuit and a low voltage-driven LSI are coupled to each other, and generates a voltage of a desired voltage level to the coupling side of a supplied power supply voltage.

A high breakdown LDMOS transistor operated at a high voltage may be integrated into an LSI chip in addition to a MOS transistor operated at a low voltage, such as used in a logic circuit. In a high breakdown MOS transistor as compared with a MOS transistor integrated into a low voltage logic circuit, the distance between its gate and drain is increased to make a drain breakdown voltage high, and further a gate insulating film is formed thick to increase a gate breakdown voltage. Therefore, in order to bring the high breakdown MOS transistor into integration, there is a need to add a process for forming the high breakdown MOS transistor aside from a process for forming the low voltage-operated MOS transistor that configures the low voltage logic circuit. In order to place in mixed form, a high voltage circuit having a low voltage logic circuit and a high breakdown MOS transistor both integrated into the same LSI chip, there is a need to form a high voltage circuit aside from an area of a semiconductor substrate, which is provided with the low voltage logic circuit. This unavoidably leads to an increase in chip area and an increase in process cost.

On the other hand, a DC-DC converter integrated into an LSI is commonly configured using active elements (specifically, a transistor and a diode) formed in a semiconductor substrate. In particular, a recent LSI, however, brings in various problems in that the DC-DC converter is configured by the active elements formed in the semiconductor substrate. Firstly, since a power supply voltage for operating a logic circuit in the process of scaling a signal voltage and a size becomes lower, it has been difficult for the logic circuit and the DC-DC converter to configure using active elements of the same design. Integrating active elements appropriate to their operating voltages into the same semiconductor substrate causes the need for the addition of a complex process and leads to an increase in chip cost.

The second resides in that a semiconductor device in which a DC-DC converter is configured by active elements formed in a semiconductor substrate causes an increase in chip size. In such a configuration that the active elements that configure the DC-DC converter are formed in the semiconductor substrate, there is a need to prepare an area in which the active elements that configure the DC-DC converter are formed, aside from an area in which the active elements that configure the logic circuit are formed. This leads to an increase in chip size, i.e., an increase in chip cost. The active elements that configure the DC-DC converter are large in size because they need the ability to drive large current. Thus, the problem of the increase in chip size can be significant. Further, a high voltage may be applied to the active elements that configure the DC-DC converter. For example, a short-circuit developed between the source and drain of a transistor device, and characteristic degradation due to the injection of electrical charges into a gate insulating film may be caused.

As a technology capable of being related to the present application, Japanese Unexamined Patent Publication No. 2010-141230 has disclosed a technology in which semiconductor layers are formed in a wiring layer and semiconductor elements are formed using the semiconductor layers. As materials for the semiconductor layers, may be mentioned oxide semiconductors such as InGaZnO (IGZO), ZnO, etc., polysilicon and amorphous silicon. As applications for the semiconductor elements provided in the wiring layer, may be mentioned transistors that are switching elements. There has also been disclosed a technology in which each of the semiconductor elements is provided with a trap film and a back-gate electrode and used as a memory element. In Japanese Unexamined Patent Publication No. 2010-141230, however, no mention is made to a circuit electrically coupled to a low voltage logic circuit via wirings using active elements that configure the low voltage logic circuit, and a DC-DC converter.

Japanese Unexamined Patent Publication No. 2007-157932 has disclosed that an amorphous semiconductor layer is formed above a semiconductor substrate formed with an integrated circuit, and an external interface circuit operated at a higher voltage than at the integrated circuit is mounted in the amorphous semiconductor layer. Incidentally, the definition of an "external interface circuit" is not shown in this publication. A circuitry coupling between an integrated circuit formed using a silicon substrate and a high voltage operation circuit located above is not definite.

RELATED ART DOCUMENTS

Patent Documents

[Patent Document 1]
Japanese Unexamined Patent Publication No. 2010-141230
[Patent Document 2]
Japanese Unexamined Patent Publication No. 2007-157932

SUMMARY

Thus, an object of the present invention is to realize at low cost, a semiconductor device in which a circuit including high breakdown active elements and a logic circuit operated at a low voltage are arranged over the same substrate in mixed form. Further, another object of the present invention is to realize a device structure capable of suppressing degradation in device characteristics even if a high voltage is applied to applications such as a DC-DC converter, etc.

In one aspect of the present invention, a semiconductor device is equipped with a logic circuit and an active element circuit. The logic circuit includes a first active element formed in a semiconductor substrate. The active element circuit includes a second active element formed using a first semiconductor layer formed over a first insulating film formed above the semiconductor substrate. The active element circuit is controlled by the logic circuit.

In one embodiment, there is provided a semiconductor device in which a DC-DC converter that generates a second power supply voltage from a first power supply voltage, and a logic circuit are integrated. The semiconductor device includes a semiconductor substrate formed with active elements that configure the logic circuit, a first insulating film formed above a semiconductor substrate, a plurality of wirings embedded in trenches provided in the first insulating film, a second insulating film provided so as to cover the first insulating film and the wirings, a first semiconductor layer formed over the second insulating film, a first source electrode coupled to the first semiconductor layer, and a first drain electrode coupled to the first semiconductor layer. The wirings include a first drain electrode provided at a position opposite to the first semiconductor layer. The first semiconductor layer, the first source electrode, the first drain electrode and the first gate electrode function as active elements that configure the DC-DC converter.

Such a semiconductor device may be used as at least one of a plurality of integrated circuit chips integrated into the same package, which configure a SiP device.

According to the present invention, there can be realized at low cost, a semiconductor device having a circuit including high breakdown active elements and a logic circuit operated at a low voltage, both of which are placed over the same substrate in mixed form.

BRIEF DESCRIPTION OF THE DRAWINGS

FIG. 8 is a plan view showing a layout of a transistor included in the DC-DC converter shown in FIG. 7;

FIG. 10 is a conceptual diagram for describing the advantage of the semiconductor device shown in FIG. 6;

FIG. 15B is a graph showing the operating characteristics of a diode in one embodiment of the present invention;

DETAILED DESCRIPTION

First Embodiment

Figure 1:
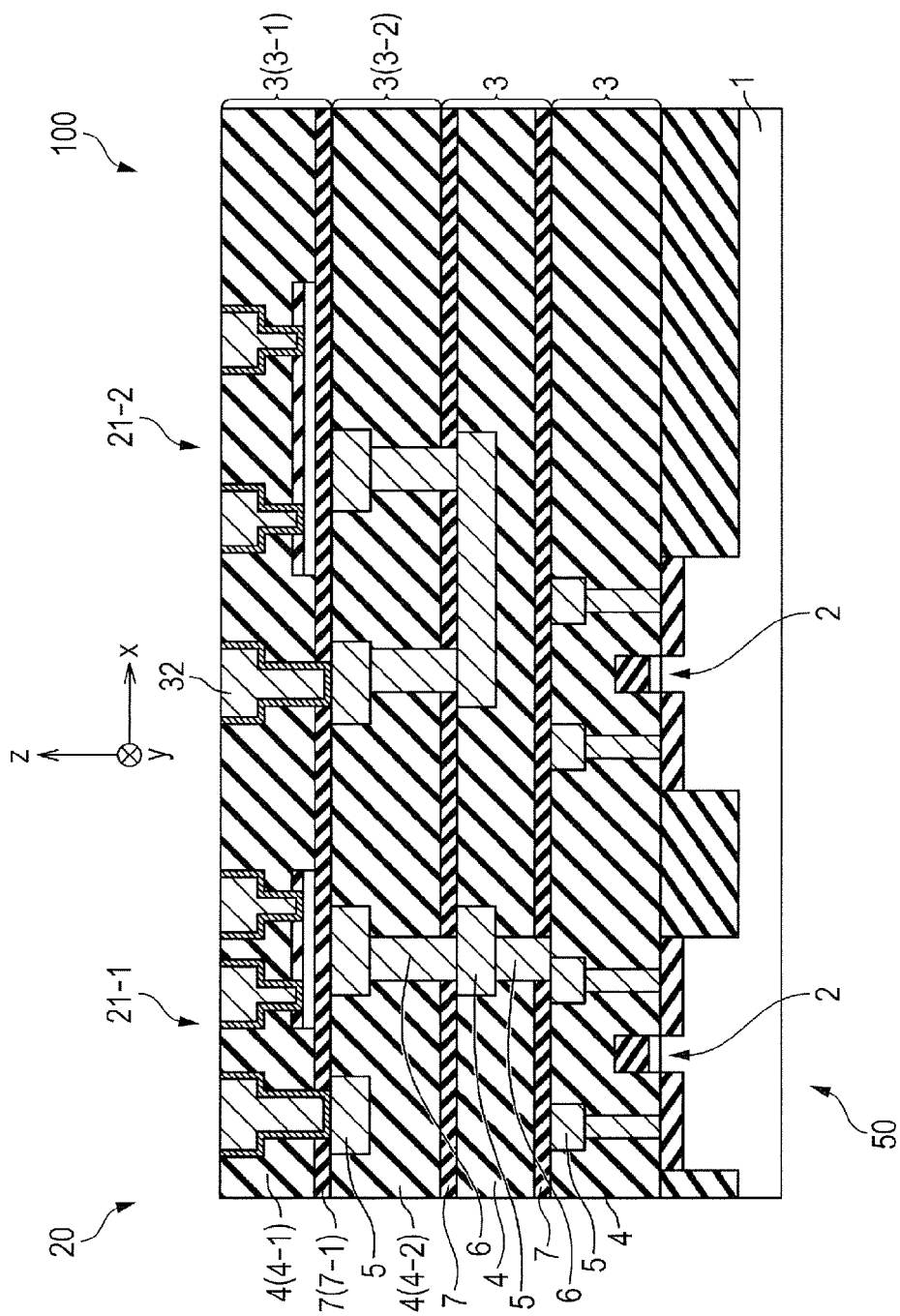
FIG. 1 is a sectional view showing a structure of a semiconductor device according to a first embodiment of the present invention.

FIG. 1 is a sectional view showing a configuration of a semiconductor device 100 according to a first embodiment of the present invention. Semiconductor elements 2 each comprised of a MOS transistor or the like are formed at a surface portion of a semiconductor substrate 1, and a plurality of wiring layers 3 are formed above the semiconductor elements 2. The semiconductor elements 2 are used as active elements that configure a logic circuit 50 integrated into the semiconductor device 100. The function of the logic circuit 50 will be described in detail later. In the present embodiment, for example, a silicon substrate is used as a semiconductor substrate 1.

Each of the wiring layers 3 has an interlayer insulating film 4 and wirings 5 embedded in wiring trenches provided at the surface of the interlayer insulating film 4. In the present embodiment, each wiring for the wiring layer 3 located at the top is of an aluminium wiring, and wirings for the wiring layers 3 other than that are copper wirings. A metal element that configures each wiring layer 3 is not limited in particular. As the interlayer insulating film 4, for example, a low dielectric constant insulating layer lower in dielectric constant than silicon oxide is used. As the low dielectric constant insulating layer, may be used, for example, an SiOC film, a SiLK film (where SiLK: Registered Trademark), an HSQ (Hydrogen Silses Quioxane) film, an MHSQ (Methyl Hydrogen Silses Quioxane) film, an MSQ (Methyl Silses Quioxane) film, or a porous film made of these. The semiconductor element 2, the wiring 5 for the wiring layer 3 located at the bottom, and the wirings 5 for the two adjacent wiring layers 3 are electrically coupled to each other by vias 6 provided so as to extend through the interlayer insulating films 4. The wirings 5 provided in the wiring layer 3, and at least some of the vias 6 are respectively used as wirings and vias that configure the logic circuit 50.

In the following, there is a case where the wiring layer 3 located at the top is described as a wiring layer 3-1, and the wiring layer 3 corresponding to the second as viewed from above is described as a wiring layer 3-2. There is also a case where the interlayer insulating film 4 located at the top is described as an interlayer insulating film 4-1, and the interlayer insulating film 4 corresponding to the second as viewed from above is described as an interlayer insulating film 4-2.

The interlayer insulating films 4 other than the interlayer insulating film 4-1 of the top layer, and the wirings 5 embedded in these are covered with diffusion preventing layers 7. Each of the diffusion preventing layers 7 is an insulating film for preventing a material (especially copper that makes up of copper wiring) for the wiring 5 from diffusing. As the diffusion preventing layer 7, may be used, for example, an SiN film, an SiO₂ film and an SiCN film. The thickness of the diffusion preventing film 7 ranges from 10 nm to 100 nm in thickness, for example. Incidentally, the diffusion preventing layer 7 situated at the top may be described as a diffusion preventing layer 7-1 below.

One feature of the semiconductor device 100 according to the present embodiment resides in that the active elements are formed in the wiring layer aside from the semiconductor substrate 1, and the logic circuit 50 in the semiconductor substrate 1 and the active elements formed in the wiring layer are formed over the same substrate in mixed form. Specifically, in the present embodiment, semiconductor layers 8-1 and 8-2 are formed in the wiring layer 3-1 located at the top, and transistors 21-1 and 21-2 are formed using the semiconductor layers 8-1 and 8-2. When the semiconductor layers 8-1 and 8-2 are formed of oxide semiconductors such as InGaZnO (IGZO), InZnO (IZO), ZnO, ZnAlO, ZnCuO, etc. here, each of the semiconductor layers 8-1 and 8-2 serves as an n-type semiconductor. In this case, the carriers of the transistors 21-1 and 21-2 are electrons.

In the present embodiment, the active elements (transistors 21-1 and 21-2) formed in the wiring layer 3-1 are used as circuit elements of a high voltage/low voltage interface 20. Here, the high voltage/low voltage interface 20 is a circuit for coupling the logic circuit 50 to a circuit operated at a high voltage. The transistor 21-1 is used as an input transistor which receives a signal from the circuit, and the transistor 21-2 is used as an input transistor which outputs a signal to the circuit. The configuration and operation of the high voltage/low voltage interface 20, especially, the form of usage of the transistors 21-1 and 21-2 will be explained in detail later.

Figure 2:
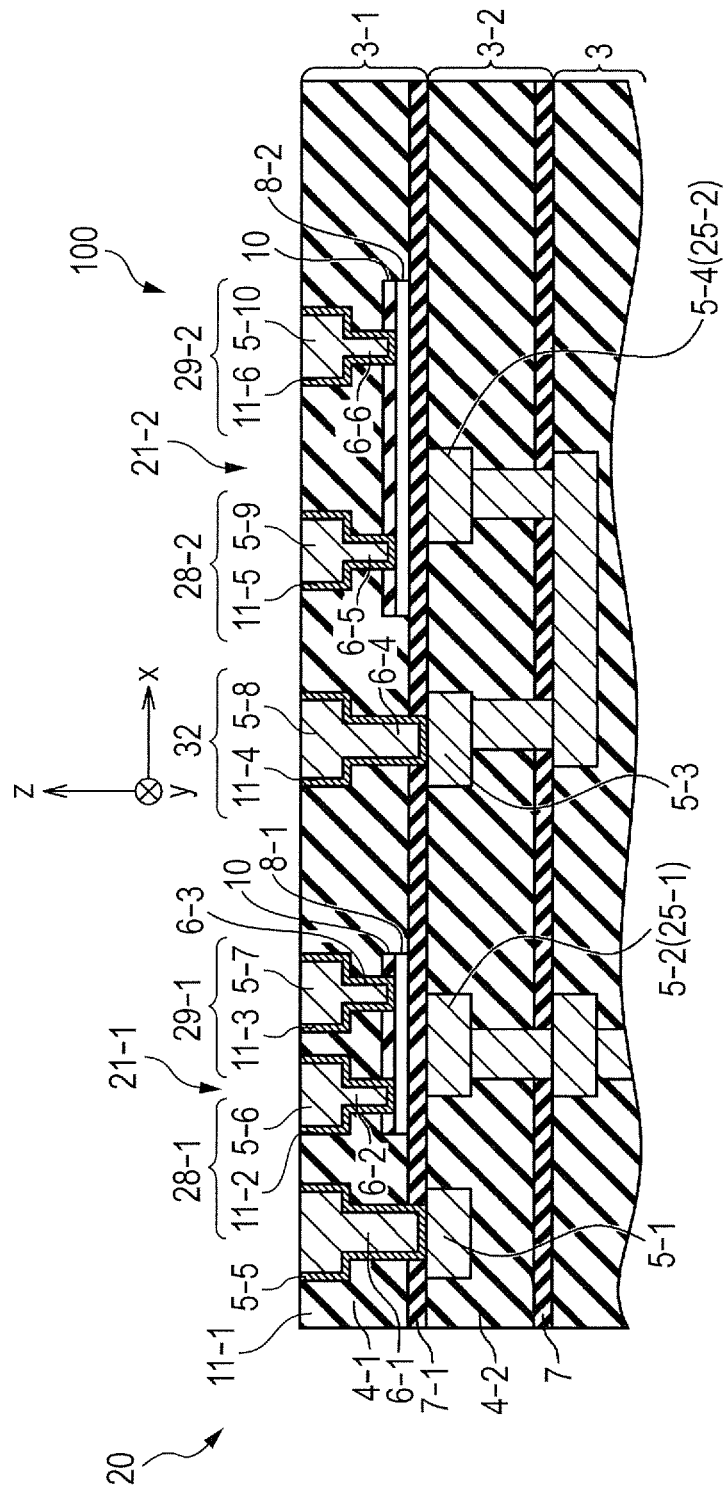
FIG. 2 is a sectional view illustrating a structure of a high voltage/low voltage interface of the semiconductor device shown in FIG. 1.

FIG. 2 is a sectional view showing the configuration of the high voltage/low voltage interface 20. Wiring trenches are formed in the interlayer insulating 4-2 corresponding to the second as viewed from above. Wirings 5-1 through 5-4 are embedded into those wiring trenches. In the present embodiment, any of the wirings 5-1 through 5-4 is a copper wiring and is formed using the Damascene method in the same wiring forming process. In the present embodiment, as will be described later, the wiring 5-2 is used as a gate electrode of the transistor 21-1, and the wiring 5-4 is used as a gate electrode of the transistor 21-2. Therefore, the wirings 5-2 and 5-4 may be described as gate electrodes 25-1 and 25-2 below. The semiconductor layer 8-1 is formed at such a position as to be opposite to the gate electrode 25-1 at the upper surface of the diffusion preventing layer 7-1. The semiconductor layer 8-2 is formed at such a position as to be opposite to the gate electrode 25-2 at the upper surface of the diffusion preventing layer 7-1.

In the present embodiment, the semiconductor layers 8-1 and 8-2 are formed of oxide semiconductors such as InGaZnO (IGZO), InZnO (IZO), ZnO, ZnAlO, ZnCuO, etc. These oxide semiconductors can be formed at a relatively low temperature (at a temperature of 400° C. or less, for example). The semiconductor layers 8-1 and 8-2 are formed of these oxide semiconductors because there is an advantage that the semiconductor layers 8-1 and 8-2 can be formed at a temperature appropriate to a wiring process commonly used for the formation of each wiring layer 3 located below the semiconductor layers 8-1 and 8-2.

A hard mask layer 10 is formed over the semiconductor layers 8-1 and 8-2. The hard mask layer 10 is an insulating film used as a mask in the process of patterning the semiconductor layers 8-1 and 8-2. For example, an $SiO_2$ film and an SiN film are used as the hard mask layer 10. The hard mask layer 10 also assumes the role of suppressing the semiconductor layers 8-1 and 8-2 from being reduced, in the manufacturing process of the semiconductor device 100. The interlayer insulating film 4-1 located at the top is formed so as to cover these semiconductor layers 8-1 and 8-2 and hard mask layer 10.

Wiring trenches and viaholes are formed in the interlayer insulating film 4-1. The wiring trenches and the viaholes are covered with barrier metal layers 11-1 through 11-6 respectively. Here, the barrier metal layer 11-1 is formed so as to contact the wiring 5-1 that belongs to the wiring layer 3-2. The barrier metal layers 11-2 and 11-3 are formed so as to contact the semiconductor layer 8-1. Further, the barrier metal layer 11-4 is formed so as to contact the wiring 5-3 that belongs to the wiring layer 3-2, and the barrier metal layers 11-5 and 11-6 are formed so as to contact the semiconductor layer 8-2. As the materials for the barrier metal layers 11-1 through 11-6, may be mentioned, for example, Ti, Ta, Ru, W, nitrides of these or oxides thereof. The barrier metal layers 11-1 through 11-6 may be a single layer film made up of these materials or may be a laminated one of two or more layers. As an example of the laminated barrier metal layers 11-1 through 11-6, may be mentioned, for example, a laminate of TiN (upper layer)/Ti (lower layer) or TaN (upper layer)/Ta (lower layer). The barrier metal layers 11-1 through 11-6 are collectively formed in the same forming process. The barrier metal layers 11-2, 11-3, 11-5 and 11-6 are formed in such a manner that ohmic contacts are formed at portions that contact the semiconductor layers 8-1 and 8-2.

Wirings 5-5 through 5-10 and vias 6-1 through 6-6 are respectively formed inside the wiring trenches and viaholes covered with the barrier metal layers 11-1 through 11-6. Any of the wirings 5-5 through 5-10 is a wiring that belongs to the wiring layer 3-1. The wirings 5-5 through 5-10 and the vias 6-1 through 6-6 are collectively formed in the same forming process. The wirings 5-6 and 5-7 are respectively coupled to the semiconductor layer 8-1 through the vias 6-2 and 6-3. The wiring 5-8 is coupled to the wiring 5-3 though the via 6-4. The wirings 5-9 and 5-10 are coupled to the semiconductor layer 8-2 through the vias 6-5 and 6-6.

Of the wirings and vias formed in the wiring layer 3-1 of the top layer, the wiring 5-8 is used as an external input terminal 32. The external input terminal 32 is electrically coupled to the wiring 5-4 used as the gate electrode 25-2. The transistor 21-2 is controlled by a voltage signal inputted to the external input terminal 32. The vias 6-2 and 6-3 are respectively used as source and drain electrodes of the transistor 21-1. In the following, the via 6-3 (and a portion of the barrier metal layer 11-2, which contacts the via 6-3) may be called a source electrode 28-1, and the via 6-4 (and a portion of the barrier metal layer 11-3, which contacts the via 6-4) may be called a drain electrode 29-1. Likewise, the vias 6-5 and 6-6 are respectively used as a source electrode 28-2 and a drain electrode 29-2 of the transistor 21-2.

Figure 3:
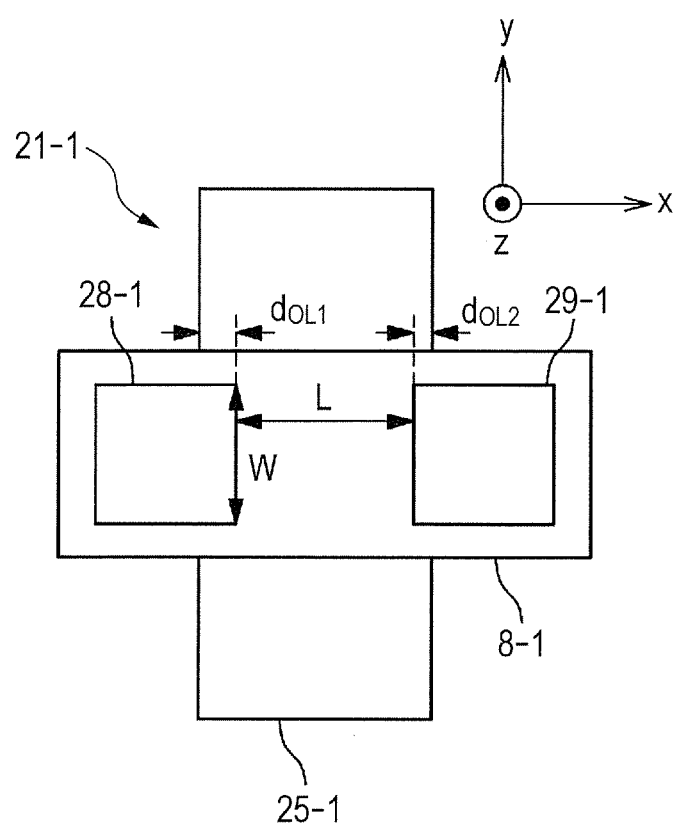
FIG. 3 is a plan view depicting a layout of a transistor included in the high voltage/low voltage interface shown in FIG. 2.

FIG. 3 is a plan view showing an example of a planar layout of the semiconductor layer 8-1, gate electrode 25-1, source electrode 28-1 and drain electrode 29-1 that configure the transistor 21-1. Here, in FIG. 3, an x axis is defined in the direction that extends from the source electrode 28-1 to the drain electrode 29-1, and a y axis is defined normal to the x axis. A portion of the semiconductor layer 8-1, which is lying between the source electrode 28-1 and the drain electrode 29-1, is opposite to the gate electrode 25-1. This portion is used as a channel region. In the planar layout of FIG. 3, the surfaces at which the source electrode 28-1, the drain electrode 29-1 and the semiconductor layer 8-1 contact each other, have shapes rectangular and identical to each other. The distance between the source electrode 28-1 and the drain electrode 29-1, which extends along the semiconductor layer 8-1, is defined as a gate length L of a thin film transistor. A y-axis direction width of each of the surfaces at which the source electrode 28-1, the drain electrode 29-1 and the semiconductor layer 8-1 contact each other is defined as a gate width W.

It should be noted in FIG. 3 here that a planar layout in which some of the source electrode 28-1 and the drain electrode 29-1 overlap with the gate electrode 25-1 has been illustrated. In FIG. 3, an overlap length of the source electrode 28-1 relative to the gate electrode 25-1 is designated at a symbol $d_{OL1}$. An overlap length of the drain electrode 29-1 relative to the gate electrode 25-1 is designated at a symbol $d_{OL2}$. Here, the overlap length indicates a distance in a in-plane direction from the end of the source electrode 28-1 or the drain electrode 29-1 to the end of the gate electrode 25-1.

Figure 4A:
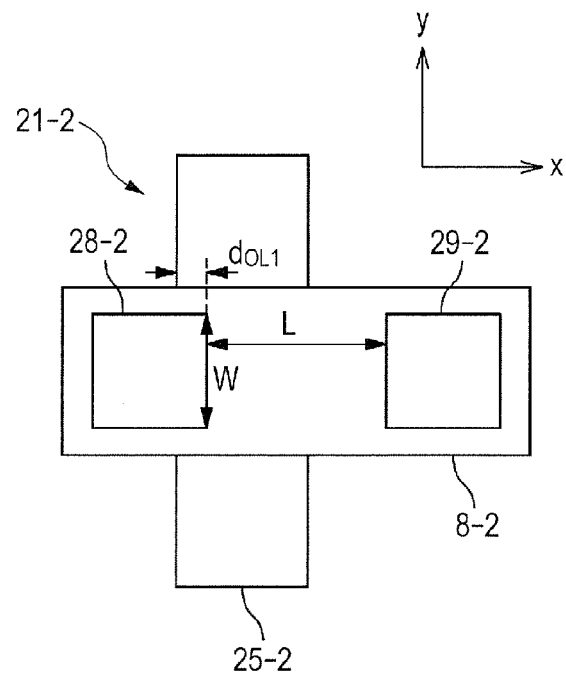
FIG. 4A is a plan view showing another layout of a transistor included in the high voltage/low voltage interface shown in FIG. 2.

On the other hand, FIG. 4A is a plan view showing an example of a planar layout of the semiconductor layer 8-2, gate electrode 25-2, source electrode 28-2 and drain electrode 29-2 that configure the transistor 21-2. Unlike the transistor 21-1, the transistor 21-2 adopts such a structure (i.e., a structure in which the surface at which the drain electrode 29-2 and the semiconductor layer 8-2 contact each other do not overlap with the gate electrode 25-2 as viewed in the vertical direction) that the drain electrode 29-2 does not overlap with the gate electrode 25-2.

Figure 4B:
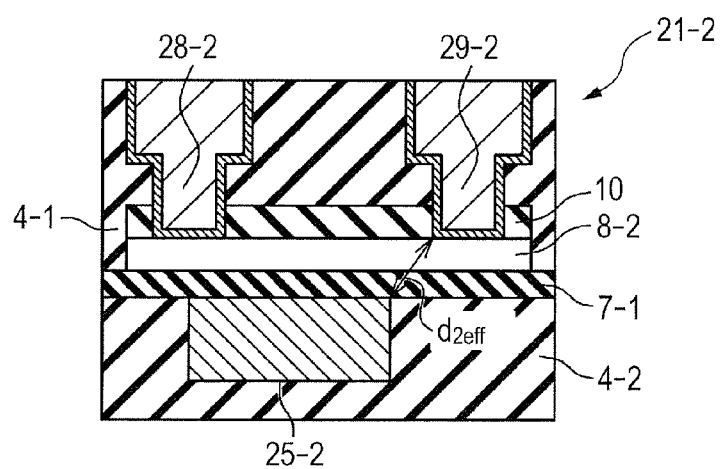
FIG. 4B is a sectional view illustrating a structure of the transistor included in the high voltage/low voltage interface shown in FIG. 2.

The structure, such as illustrated in FIG. 4A, in which the drain electrode 29-2 does not overlap with the gate electrode 25-2 has two advantages. Firstly, the structure has the role of increasing a breakdown voltage between the drain electrode 29-2 and the gate electrode 25-2. In the structure in which the drain electrode 29-2 does not overlap with the gate electrode 25-2, the distance $d_{2eff}$ between the drain electrode 29-2 and the gate electrode 25-2 becomes large as shown in FIG. 4B. With the increase in the distance $d_{2eff}$, an effective field intensity applied to the gate electrode 25-2 by the application of a drain voltage is reduced. Thus, the breakdown voltage between the drain electrode 29-2 and the gate electrode 25-2 can effectively be enhanced.

Secondly, the structure in which the drain electrode 29-2 does not overlap with the gate electrode 25-2 is hard to cause a deterioration in threshold value and an increase in gate leak due to the injection of hot carriers where a high drain voltage is applied, and obtains a stable operation. Thus, the structure in which the drain electrode 29-2 does not overlap with the gate electrode 25-2 is advantageous for the operation of applying a high drain voltage to the drain electrode 29-2. As will be described later, such an advantage is particularly effective to use the transistor 21-2 as an input transistor for the high voltage/low voltage interface 20.

Figure 5:
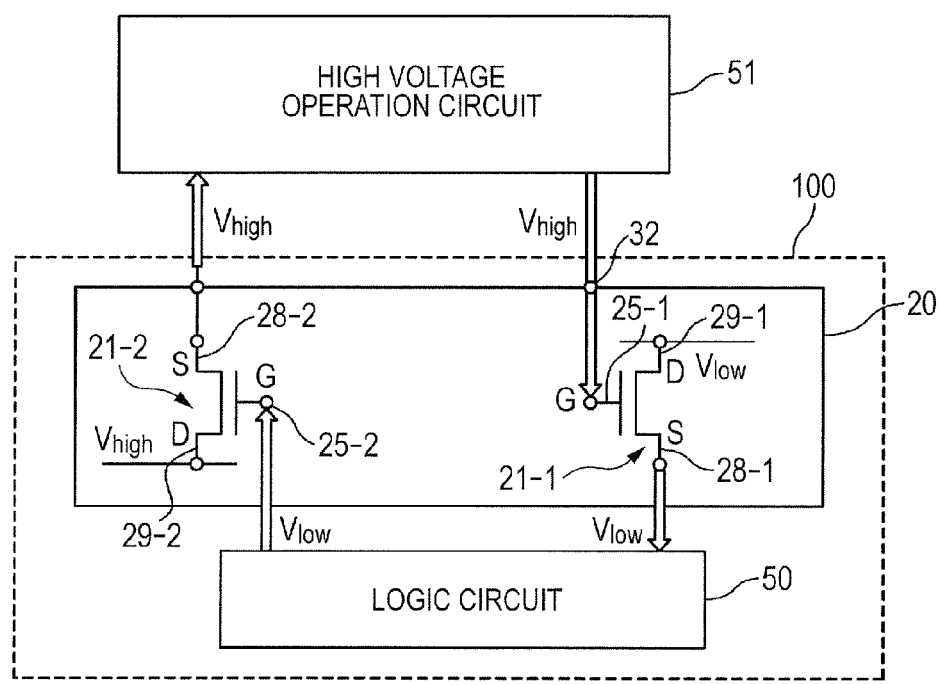
FIG. 5 is a block diagram depicting a configuration of the semiconductor device according to the first embodiment.

FIG. 5 is a block diagram showing a circuit configuration of the semiconductor device 100 according to the first embodiment. The semiconductor device 100 has a configuration in which the logic circuit 50 and the high voltage/low voltage interface 20 are integrated into the same semiconductor substrate. Here, the high voltage/low voltage interface 20 has the role of exchanging signals between the logic circuit 50 operated at a relatively low voltage and a high voltage operation circuit 51 operated at a high voltage. In the present embodiment, the logic circuit 50 operates at a power supply voltage that is $V_{low}$ relatively low in voltage level. The high voltage operation circuit 51 operates at a power supply voltage that is $V_{high}$ (>$V_{low}$) relatively high in voltage level. Here, the above transistors 21-1 and 21-2 are operated as input and output transistors for the high voltage/low voltage interface 20.

Specifically, the transistor 21-1 of the high voltage/low voltage interface 20 outputs a signal (low voltage signal) having a relatively low voltage level corresponding to the logic circuit 50 in response to a signal (high voltage signal) having a relatively high voltage level, which is transmitted from the high voltage operation circuit 51. In the transistor 21-1, its drain electrode 29-1 is supplied with the power supply voltage $V_{low}$, and its gate electrode 25-1 is supplied with a high voltage signal from the high voltage operation circuit 51. The high voltage signal supplied from the high voltage operation circuit 51 has a voltage level of either a ground voltage or the power supply voltage $V_{high}$. When the high voltage signal supplied from the high voltage operation circuit 51 is set to the power supply voltage $V_{high}$, the voltage $V_{low}$ is outputted from the source electrode 28-1 of the transistor 21-1 to the logic circuit 50.

On the other hand, the transistor 21-2 of the high voltage/low voltage interface 20 outputs a signal (high voltage signal) having a relatively high voltage level corresponding to the high voltage operation circuit 51 in response to a signal (low voltage signal) having a relatively low voltage level, which is transmitted from the logic circuit 50. In the transistor 21-2, its drain electrode 29-2 is supplied with a power supply voltage $V_{high}$, and its gate electrode 25-2 is supplied with a low voltage signal from the logic circuit 50. Here, as shown in FIG. 1, the supply of the low voltage signal from the logic circuit 50 to the gate electrode 25-2 is performed through the wiring 5 and the via 6 formed in the wiring layer 3. Referring to FIG. 5 again, the low voltage signal supplied from the logic circuit 50 has the voltage level of either the ground voltage or the voltage $V_{low}$. When the low voltage signal supplied from the logic circuit 50 is set to the voltage $V_{low}$, the voltage $V_{high}$ is outputted from the source electrode 28-2 of the transistor 21-2 to the high voltage operation circuit 51.

It should be noted here that the structure in which the drain electrode 29-2 does not overlap with the gate electrode 25-2 has been adopted in the transistor 21-2 of which the drain electrode 29-2 is supplied with the relatively high power supply voltage $V_{high}$. As described above, the structure in which the drain electrode 29-2 does not overlap with the gate electrode 25-2 is advantageous for the purpose of improving a breakdown voltage where a high drain voltage is applied to the drain electrode 29-2, and further realizing a stable operation.

The configuration of the semiconductor device 100 according to the present embodiment described above has various advantages. The first advantage resides in that the active elements (transistors 21-1 and 21-2 in the present embodiment) used in the circuit (high voltage/low voltage interface 20) used to couple the high voltage operation circuit 51 and the logic circuit 50 to each other need not to be integrated into the semiconductor substrate 1. When the active elements having the characteristics appropriate to the circuit used to couple the high voltage operation circuit 51 and the logic circuit 50, and the active elements having the characteristics appropriate to the logic circuit 50 are both integrated into the same semiconductor substrate, a complex manufacturing process may be needed. On the other hand, in the present embodiment, since the active elements used in the high voltage/low voltage interface 20 are respectively formed in the semiconductor layers 8-1 and 8-2 provided aside from the semiconductor substrate 1, such a problem can be solved.

Secondly, according to the structure of the semiconductor device 100 according to the present embodiment, the area of a chip can be reduced. In the semiconductor device 100 according to the present embodiment, the high voltage/low voltage interface 20 can be provided above the area (area where the semiconductor elements 2 are provided) where the logic circuit 50 is provided. It is therefore unnecessary to prepare an area dedicated to provide the high voltage/low voltage interface 20. This is effective in reducing the chip area.

In addition, the semiconductor device 100 according to the present embodiment also has an advantage that the breakdown voltages of the active elements (transistors 21-1 and 21-2) used in the high voltage/low voltage interface 20 can be adjusted to a wide range. In the present embodiment, the active elements used in the high voltage/low voltage interface 20 can be designed as high breakdown elements by design. First, if the thickness of the diffusion preventing layer 7-1 is made thick, then the breakdown voltage of each circuit element used in the high voltage/low voltage interface 20 can be increased. Making thick the thickness of the diffusion preventing layer 7-1, for example, makes it possible to design the breakdown voltage between the source electrode 28-1 and the gate electrode 25-1 of the transistor 21-1 and the breakdown voltage between the drain electrode 29-1 and the gate electrode 25-1 of the transistor 21-1 to 20V to 100V.

Further, the breakdown voltages of the circuit elements used in the high voltage/low voltage interface 20 can be increased even by selecting materials large in bandgap as the semiconductor layers 8-1 and 8-2. Since the oxide semiconductor generally has a bandgap wider than a band gap (about 1.2 eV) of silicon, for example, the breakdown voltage between the source and drain electrodes can be made high by using the oxide semiconductors as the semiconductor layers 8-1 and 8-2. For example, the bandgap of InGaZnO (IGZO) ranges from 3.3 eV to 3.4 eV. Even other oxide semiconductors (InZnO (IZO)), ZnO, ZnAlO, ZnCuO, etc.) indicate a bandgap greater than or equal to 3.2 eV.

Further, as in the transistors 21-2 employed in the present embodiment, the structure in which the drain electrode 29-2 does not overlap with the gate electrode 25-2 is adopted, thereby making it possible to increase the breakdown voltage between the drain electrode 29-2 and the gate electrode 25-2 and realize the stable operation where the high drain voltage is applied to the drain electrode 29-2.

The semiconductor device 100 according to the present embodiment may be applied to a SiP (system in package) in which a plurality of LSI chips are integrated into a single package. In this case, in one embodiment, the SiP device may be provided with an LSI chip in which the high voltage operation circuit 51 is integrated, and an LSI chip in which the semiconductor device 100 according to the present embodiment is integrated.

Second Embodiment

Figure 6:
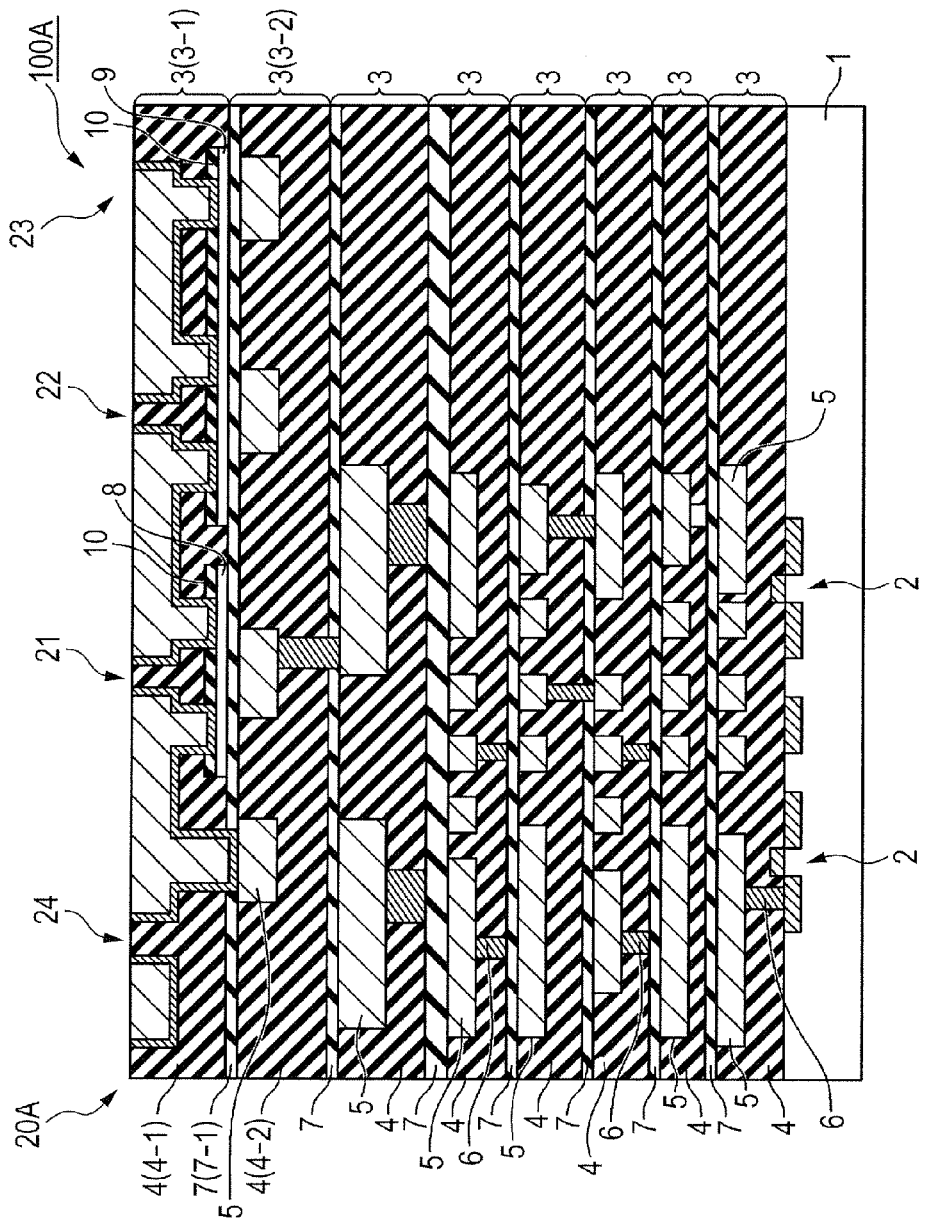
FIG. 6 is a sectional view showing a structure of a semiconductor device according to a second embodiment of the present invention.

FIG. 6 is a sectional view showing a configuration of a semiconductor device 100A according to a second embodiment of the present invention. The semiconductor device 100A has a structure similar to that of the semiconductor device 100 according to the first embodiment. In the present embodiment, however, semiconductor layers 8 and 9 are formed in a wiring layer 3-1 located at the top. A DC-DC converter 20A is configured by using circuit elements fabricated using the semiconductor layers. The DC-DC converter 20A is controlled by a logic circuit 50 provided with semiconductor elements 2 formed in a semiconductor substrate 1.

Specifically, in the present embodiment, the semiconductor layers 8 and 9 are formed in the wiring layer 3-1 located at the top. A transistor 21 is formed in the semiconductor layer 8, and a diode 22 and a capacitor 23 are formed in the semiconductor layer 9. The transistor 21 is an active element which performs a switching operation at the DC-DC converter 20A. The diode 22 is configured as a diode-coupled thin film transistor and provides rectification at the DC-DC converter 20A. These transistor 21, diode 22 and capacitor 23, and an inductor 24 formed in the wiring layer 3-1 configure the DC-DC converter 20A. When the semiconductor layers 8 and 9 are formed of oxide semiconductors such as InGaZnO (IGZO), InZnO (IZO)), ZnO, ZnAlO, ZnCuO, etc. herein, each of the semiconductor layers 8 and 9 becomes an n-type semiconductor. In this case, the carriers of the thin film transistors used as the transistor 21 and the diode 22 are electrons.

Figure 7:
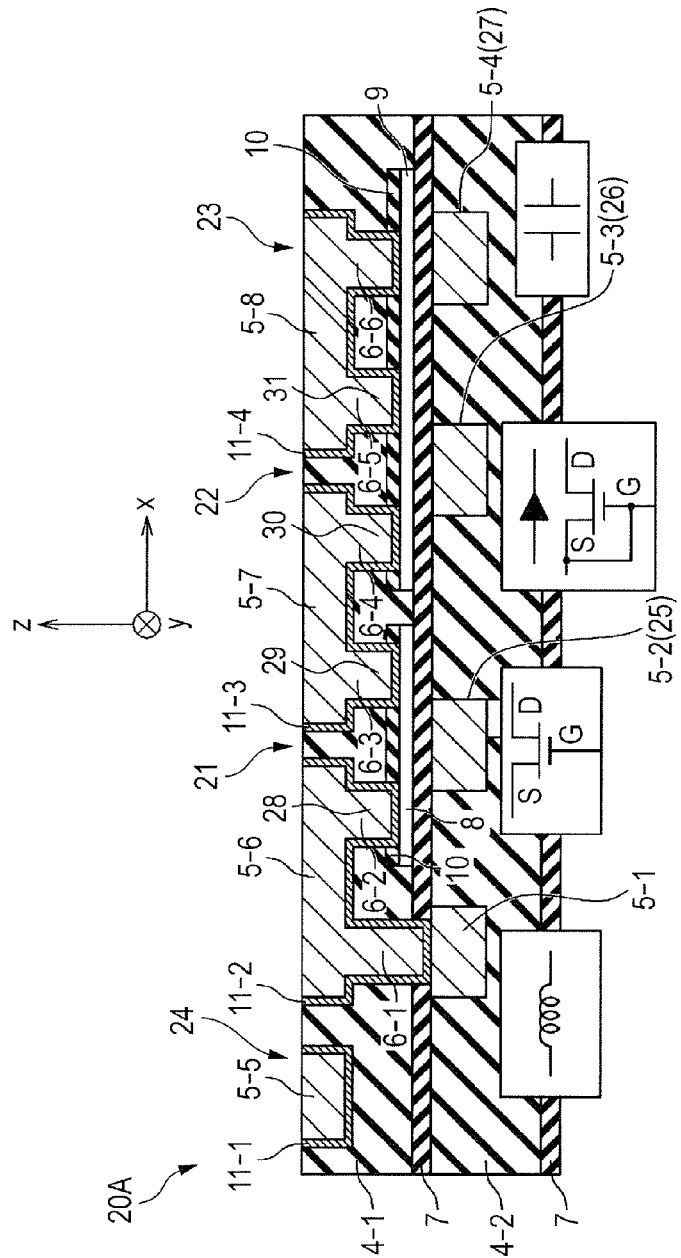
FIG. 7 is a sectional view illustrating a structure of a DC-DC converter of the semiconductor device shown in FIG. 6.

FIG. 7 is a sectional view showing a structure of the DC-DC converter 20A. Wiring trenches are formed in an interlayer insulating film 4-2 corresponding to the second as viewed from above. Wirings 5-1 through 5-4 are embedded into those wiring trenches respectively. In the present embodiment, any of the wirings 5-1 through 5-4 is a copper wiring and is formed using the Damascene method in the same wiring forming process. In the present embodiment, as will be described later, the wiring 5-2 is used as a gate electrode of the transistor 21. Therefore, the wiring 5-2 may be described as a gate electrode 25 below. The semiconductor layer 8 is formed at such a position as to be opposite to the gate electrode 25 at the upper surface of a diffusion preventing layer 7-1.

In the present embodiment as well, the diode 22 is configured by the diode-coupled thin film transistor. The wiring 5-3 is used as a gate electrode of the thin film transistor. Therefore, the wiring 5-3 may be described below as a gate electrode 26. Further, the capacitor 23 is formed of the wiring 5-4, the semiconductor layer 9 and the diffusion preventing layer 7-1 interposed between the wiring 5-4 and the semiconductor layer 9. Therefore, the wiring 5-4 may be described as a capacitor electrode 27. The semiconductor layer 9 is formed at such a position as to be opposite to the gate electrode 26 and the capacitor electrode 27 at the upper surface of the diffusion preventing layer 7-1.

Even in the present embodiment, the semiconductor layers 8 and 9 are formed of the oxide semiconductors such as InGaZnO (IGZO), InZnO (IZO)), ZnO, ZnAlO, ZnCuO, etc. These oxide semiconductors can be formed at a relatively low temperature (e.g., a temperature of 400° C. or less). The semiconductor layers 8 and 9 are formed of these oxide semiconductors because there is an advantage that the semiconductor layers 8 and 9 can be formed at a temperature appropriate to a wiring process generally used for the formation of each wiring layer 3 located below the semiconductor layers 8 and 9.

A hard mask layer 10 is formed over the semiconductor layers 8 and 9. The hard mask layer 10 is an insulating film used as a mask in the process of patterning the semiconductor layers 8 and 9. For example, an $SiO_2$ film or an SiN film is used as the hard mask layer 10. The hard mask layer 10 also assumes the role of suppressing the semiconductor layers 8 and 9 from being reduced, in the manufacturing process of the semiconductor device 100A. An interlayer insulating film 4-1 located at the top is formed so as to cover these semiconductor layers 8 and 9 and hard mask layer 10.

Wiring trenches and viaholes are formed in the interlayer insulating film 4-1. The wiring trenches and the viaholes are covered with barrier metal layers 11-1 through 11-4 respectively. Here, the barrier metal layer 11-1 is formed so as to contact the wiring 5-1 that belongs to a wiring layer 3-2. The barrier metal layer 11-2 is formed so as to contact the wiring 5-1 and the semiconductor layer 8. Further, the barrier metal layer 11-3 is formed so as to contact the semiconductor layers 8 and 9. The barrier metal layer 11-4 is formed so as to contact the semiconductor layer 9. As the materials for the barrier metal layers 11-1 through 11-4, may be mentioned, for example, Ti, Ta, Ru, W, nitrides of these or oxides thereof. The barrier metal layers 11-1 through 11-4 may be a single layer film made up of these materials or may be a laminated one of two or more layers. As an example of the laminated barrier metal layers 11-1 through 11-4, may be mentioned, for example, a laminate of TiN (upper layer)/Ti (lower layer) or TaN (upper layer)/Ta (lower layer). The barrier metal layers 11-1 through 11-4 are collectively formed in the same forming process. The barrier metal layers 11-2 through 11-4 are formed in such a manner that ohmic contacts are formed at portions that contact the semiconductor layers 8 and 9.

Wirings 5-5 through 5-8 and vias 6-1 through 6-7 are respectively formed inside the wiring trenches and viaholes covered with the barrier metal layers 11-1 through 11-4. Any of the wirings 5-5 through 5-8 is a wiring that belongs to a wiring layer 3-1. The wirings 5-5 through 5-8 and the vias 6-1 through 6-7 are collectively formed in the same forming process. The wiring 5-5 is coupled to the wiring 5-7 via an unillustrated path. The wiring 5-6 is coupled to the wiring 5-1 and the semiconductor layer 8 though the vias 6-2 and 6-3 respectively. The wiring 5-7 is coupled to the semiconductor layers 8 and 9 through the vias 6-4 and 6-5 and coupled to the wiring 5-3 (i.e., the gate electrode 26 of the diode 22) through a wiring and a via not shown in the drawing. The wiring 5-8 is coupled to the semiconductor layer 9 through the vias 6-6 and 6-7.

Of the wirings and vias formed in the wiring layer 3-1 of the top layer, the wiring 5-5 is used as the inductor 24. The vias 6-3 and 6-4 are respectively used as source and drain electrodes of the transistor 21. In the following, the via 6-3 (and a portion of the barrier metal layer 11-2, which contacts the via 6-3) may be called a source electrode 28, and the via 6-4 (and a portion of the barrier metal layer 11-3, which contacts the via 6-4) may be called a drain electrode 29. Likewise, the vias 6-5 and 6-6 are respectively used as a source electrode and a drain electrode of the thin film transistor that configures the diode 22. In the following, the via 6-5 (a portion of the barrier metal layer 11-3, which contacts the via 6-5) may be called a source electrode 30, and the via 6-6 (and a portion of the barrier metal 11-4, which contacts the via 6-6) may be called a drain electrode 31.

Further, although not shown in the drawing, wirings and vias are formed in the wiring layer 3-1 located in the top layer even at other than the wirings 5-5 through 5-8 and the vias 6-1 through 6-7 shown in FIG. 6. Those wirings and vias become components for an integrated circuit (e.g., a logic circuit) integrated into the semiconductor device 100A.

FIG. 8 is a plan view showing an example of a planar layout of the semiconductor layer 8, the gate electrode 25, the source electrode 28 and the drain electrode 29 that configure the transistor 21. Here, in FIG. 8, an x axis is defined in the direction that extends from the source electrode 28 to the drain electrode 29, and a y axis is defined normal to the x axis. A portion of the semiconductor layer 8, which is lying between the source electrode 28 and the drain electrode 29, is opposite to the gate electrode 25. This portion is used as a channel region. In the planar layout of FIG. 8, the surfaces at which the source electrode 28, the drain electrode 29 and the semiconductor layer 8 contact each other, have shapes rectangular and identical to each other. The distance between the source electrode 28 and the drain electrode 29, which extends along the semiconductor layer 8, is defined as a gate length L of the thin film transistor. A y-axis direction width of each of the surfaces at which the source electrode 28, the drain electrode 29 and the semiconductor layer 8 contact each other is defined as a gate width W. Although not shown in the drawing, the thin film transistor that configures the diode 22 also has a structure of a planar layout similar to the above. It should be noted in FIG. 8 here that a planar layout in which some of the source electrode 28 and the drain electrode 29 overlap with the gate electrode 25 has been illustrated. In FIG. 8, an overlap length of the source electrode 28 relative to the gate electrode 25 is designated at a symbol $d_{OL1}$. An overlap length of the drain electrode 29 relative to the gate electrode 25 is designated at a symbol $d_{OL2}$.

Figure 9A:
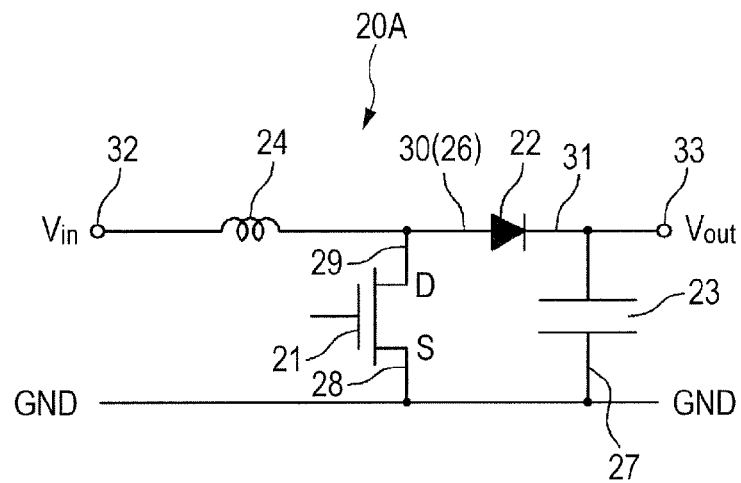
FIG. 9A is a circuit diagram depicting one example of a circuit topology of the DC-DC converter in the semiconductor device according to the second embodiment.

FIG. 9A is a diagram showing a circuit configuration of the DC-DC converter 20A in the present embodiment. The DC-DC converter 20A converts a power supply voltage Vin inputted to an input terminal 32 to a power supply voltage Vout and outputs the power supply voltage Vout from an output terminal 32. The power supply voltage Vout is supplied to the integrated circuit integrated into the semiconductor device 100A.

The DC-DC converter 20A is configured to have such a circuit topology as to be described below. An inductor 24 is coupled between a drain electrode 29 of a transistor 21 and the input terminal 32. The drain electrode 29 of the transistor 21 is coupled to an anode (i.e., a source electrode 30 and a gate electrode 26 coupled in common) of a diode 22. A source electrode 28 of the transistor 21 is coupled to a ground terminal. A cathode (i.e., a drain electrode 31) of the diode 22 is coupled to an output terminal 33. A capacitor 23 is coupled between the output terminal 33 and the ground terminal. The DC-DC converter 20A having such a circuit topology operates as a step-up DC-DC converter.

Figure 9B:
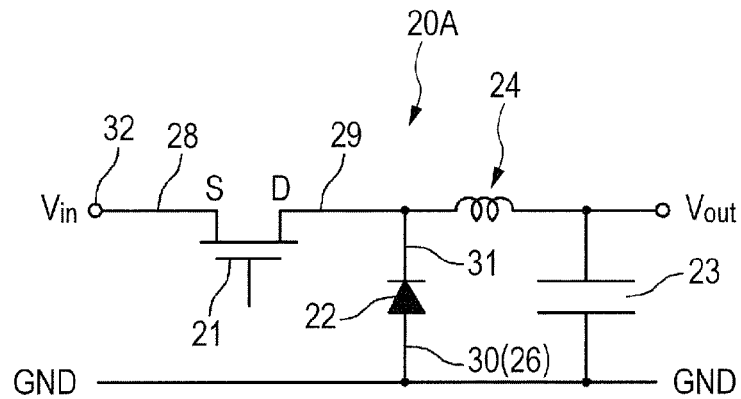
FIG. 9B is a circuit diagram showing another example of the circuit topology of the DC-DC converter in the semiconductor device according to the second embodiment.

The DC-DC converter 20A assumes various circuit topologies even at other than the circuit topology illustrated in FIG. 9A. FIG. 9B illustrates another circuit configuration of the DC-DC converter 20A. In the circuit configuration of FIG. 9B, a source electrode 28 of a transistor 21 is coupled to an input terminal 32, and a drain electrode 29 thereof is coupled to a cathode electrode of a diode 22. An anode electrode of the diode 22 is coupled to a ground terminal. An inductor 24 is coupled between a cathode of the diode 22 and an output terminal 33. A capacitor 23 is coupled between the output terminal 33 and the ground terminal. The DC-DC converter 20A having such a circuit topology operates as a step-down DC-DC converter. It will easily be understood by those skilled in the art that the DC-DC converter 20A having the circuit topology shown in FIG. 9B can be integrated into the semiconductor device 100A by suitably determining the relationship of coupling between the wirings 5 and vias 6 in the respective wiring layers 3.

Although there has been illustrated in FIG. 8, the configuration in which the capacitor 23 and the inductor 24 are monolithically integrated into the semiconductor device 100A, an external capacitor (which is not integrated in the semiconductor device 100A) may be used instead of the capacitor 23. Alternatively, an external inductor may be used instead of the inductor 24.

The configuration of the semiconductor device 100A according to the second embodiment described above has advantages similar to those in the semiconductor device 100 according to the first embodiment. Firstly, there is an advantage that the circuit elements (active elements and capacitors) used in the DC-DC converter need not to be integrated into the semiconductor substrate 1. When the circuit elements having the characteristics appropriate to the DC-DC converter, and the circuit elements having the characteristics appropriate to the logic circuit are both integrated into the same semiconductor substrate as described above, a complex manufacturing process may be needed. On the other hand, in the present embodiment, since the circuit elements (at least some thereof) used in the DC-DC converter 20A are respectively formed in the semiconductor layers 8 and 9 provided aside from the semiconductor substrate 1, such a problem can be solved.

Secondly, according to the structure of the semiconductor device 100A according to the present embodiment, the area of a chip can be reduced. In a semiconductor device 300 in which both of circuit elements used in a DC-DC converter 310 and circuit elements used in a logic circuit 320 are integrated into a semiconductor substrate, as illustrated in the left diagram of FIG. 10, there is a need to prepare an area in which the DC-DC converter 310 is provided, aside from an area in which the logic circuit 320 is provided. On the other hand, since the DC-DC converter 20A can be provided above the area (area in which the semiconductor elements 2 are provided) in which the logic circuit 50 is provided, in the semiconductor device 100A according to the present embodiment, there is no need to prepare an area dedicated to provide the DC-DC converter 20A. This is effective in reducing the chip area.

In addition, the semiconductor device 100A according to the present embodiment also has an advantage that the breakdown voltages of the circuit elements (transistor 21, diode 22 and capacitor 23) used in the DC-DC converter 20A can be adjusted to a wide range. The breakdown voltages of the circuit elements used in the DC-DC converter 20A can be adjusted to fit a wide range by suitably selecting the material and thickness of the diffusion preventing layer 7-1. In the present embodiment in particular, the respective circuit elements used in the DC-DC converter 20A can be designed as high breakdown elements by design.

First, if the thickness of the diffusion preventing layer 7-1 is made thick, then the breakdown voltage of each circuit element used in the DC-DC converter 20A can be increased. Making thick the thickness of the diffusion preventing layer 7-1, for example, makes it possible to design the breakdown voltage between the source electrode 28 and the gate electrode 25 of the transistor 21 and the breakdown voltage between the drain electrode 29 and the gate electrode 25 thereof to 20V to 100V. The breakdown voltage between the drain electrode 31 of the diode 22 and its gate electrode 26 can be designed to 20V to 100V by making thick the thickness of the diffusion preventing layer 7-1.

Further, the breakdown voltage of each circuit element used in the DC-DC converter 20A can be increased even by selecting materials large in bandgap as the semiconductor layers 8 and 9. Since the oxide semiconductor generally has a bandgap wider than the band gap (about 1.2 eV) of silicon, for example, the breakdown voltage between the source and drain electrodes can be made high by using the oxide semiconductors as the semiconductor layers 8 and 9. For example, the bandgap of InGaZnO (IGZO) ranges from 3.3 eV to 3.4 eV. Even other oxide semiconductors (InZnO (IZO)), ZnO, ZnAlO, ZnCuO, etc.) indicate a bandgap greater than or equal to 3.2 eV.

Thus, according to the structure of the semiconductor device 100A of the present embodiment, there can be realized by its design, the DC-DC converter using such circuit elements that the breakdown voltage hard for a CMOS integrated circuit using a general silicon semiconductor substrate to achieve its realization ranges from 20V to 100V.

Figure 11A:
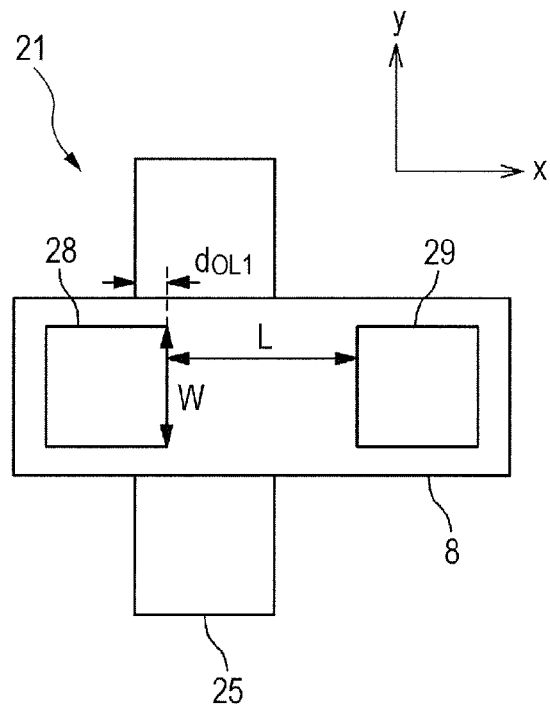
FIG. 11A is a layout diagram showing another planar layout of a transistor in the semiconductor device according to the second embodiment.
Figure 11B:
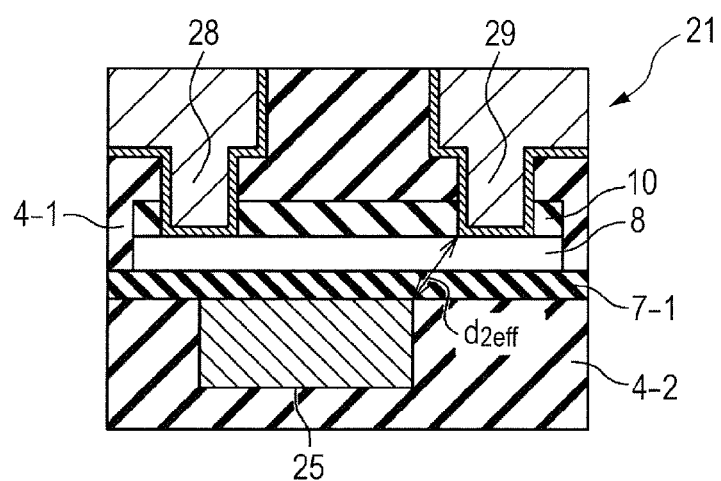
FIG. 11B is a sectional view depicting a sectional structure of the transistor illustrated in FIG. 11A.

As with the first embodiment, the breakdown voltages of the transistor 21 and the diode 22 used in the DC-DC converter 20A can also be adjusted by optimizing the layout of the source electrode, the drain electrode and the gate electrode. Adopting such a structure (i.e., such a structure that the surface at which the semiconductor layer 8 makes contact with the drain electrode 29 does not overlap with the gate electrode 25 as viewed in the vertical direction of the semiconductor substrate 1) that the drain electrode 29 of the transistor 21 does not overlap with the gate electrode 25 as illustrated in FIG. 11A, for example, is effective in increasing the breakdown voltage between the drain electrode 29 and the gate electrode 25. In the structure in which the drain electrode 29 does not overlap with the gate electrode 25, the distance $d_{2\mathit{eff}}$ between the drain electrode 29 and the gate electrode 25 becomes large as illustrated in FIG. 11B. With the increase in the distance $d_{2\mathit{eff}}$, an effective field intensity applied to the gate electrode 25 by the application of a drain voltage is reduced. Thus, the breakdown voltage between the drain electrode 29 and the gate electrode 25 can effectively be enhanced. Increasing the breakdown voltage between the drain electrode 29 and the gate electrode 25 is effective for the step-up DC-DC converter 20A having the circuit configuration illustrated in FIG. 9A, for example.

Figure 12A:
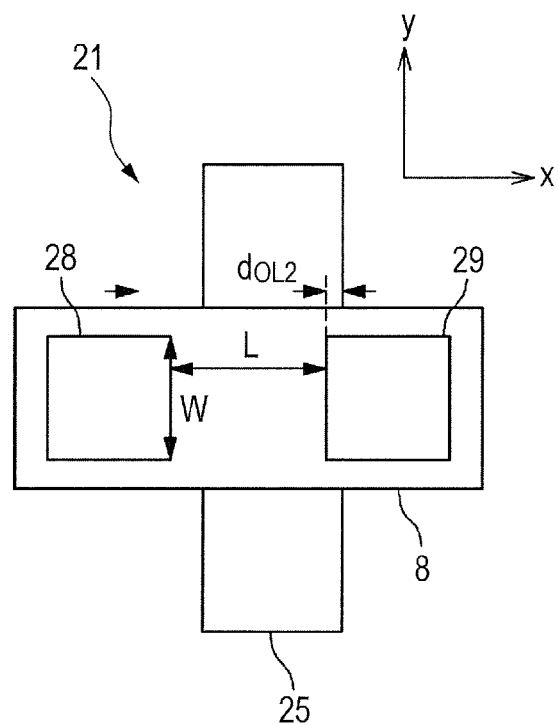
FIG. 12A is a layout diagram showing a further planar layout of a transistor in the semiconductor device according to the second embodiment.
Figure 12B:
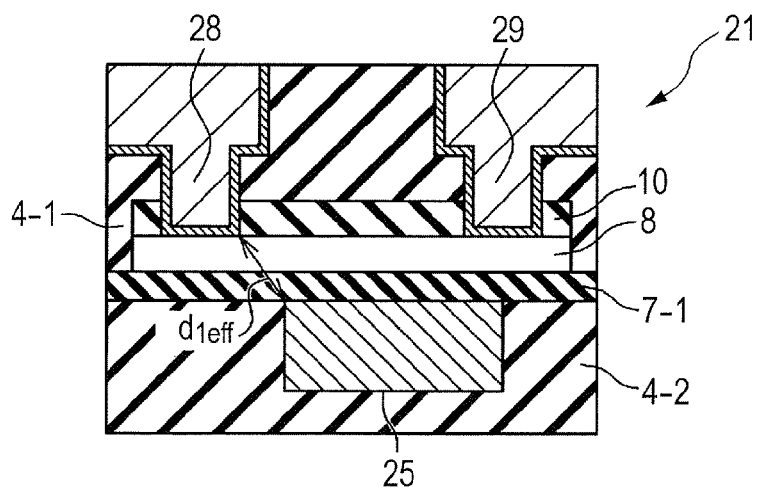
FIG. 12B is a sectional view depicting a sectional structure of the transistor illustrated in FIG. 12A.

The breakdown voltage between the source electrode 28 and the gate electrode 25 is similar to the above. Adopting such a structure (i.e., such a structure that the surface at which the semiconductor layer 8 contacts the source electrode 28 does not overlap with the gate electrode 25 in the vertical direction of the semiconductor substrate 1) that the source electrode 28 of the transistor 21 does not overlap with the gate electrode 25 as illustrated in FIG. 12A is effective in increasing the breakdown voltage between the source electrode 28 and the gate electrode 25. As shown in FIG. 12B, such a structure increases the distance $d_{1\mathit{eff}}$ between the source electrode 28 and the gate electrode 25 and reduces an effective field intensity applied to the gate electrode 25 by the application of a source voltage. Thus, the breakdown voltage between the source electrode 28 and the gate electrode 25 can effectively be increased. Increasing the breakdown voltage between the source electrode 28 and the gate electrode 25 is effective for the step-down DC-DC converter 20A having the circuit configuration shown in FIG. 9B, for example.

Figure 12C:
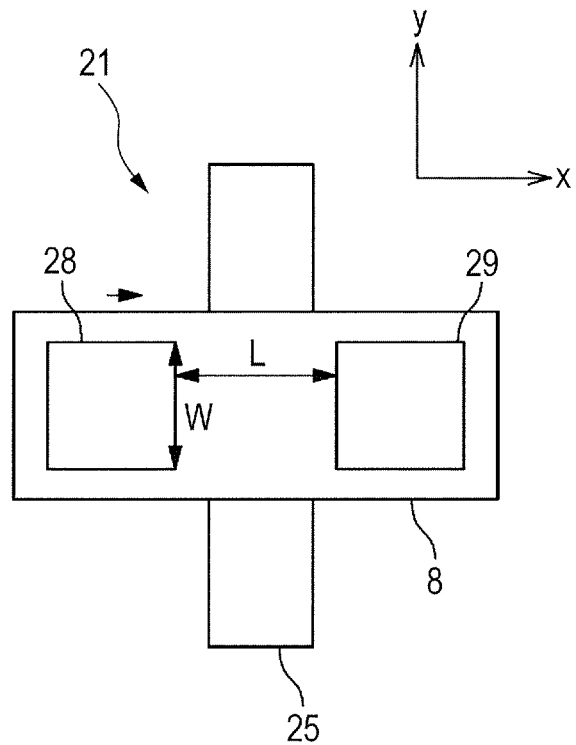
FIG. 12C is a layout diagram showing a still further planar layout of a transistor in the semiconductor device according to the second embodiment.
Figure 12D:
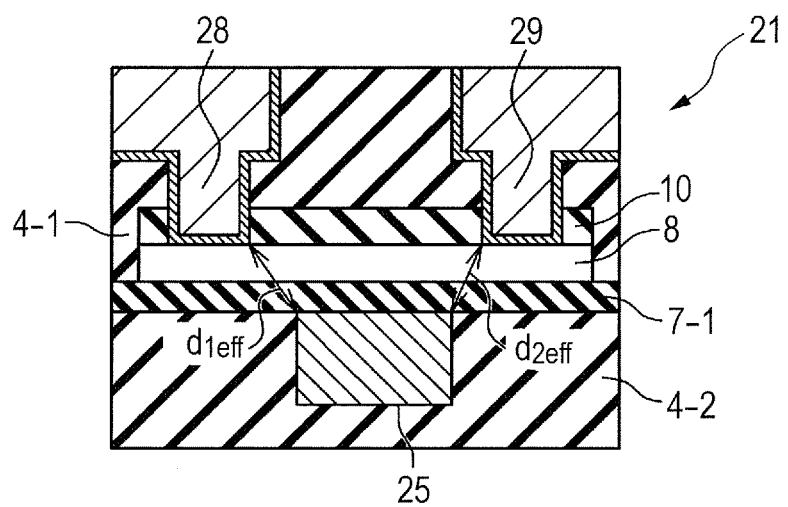
FIG. 12D is a sectional view showing a sectional structure of the transistor illustrated in FIG. 12B.

Such a structure that both the source and drain electrodes 28 and 29 of the transistor 21 do not overlap with the gate electrode 25 is also enabled as illustrated in FIGS. 12C and 12D. According to such a structure, both the breakdown voltage between the drain electrode 29 and the gate electrode 25 and the breakdown voltage between the source electrode 28 and the gate electrode 25 can effectively be increased.

Further, the breakdown voltage between the drain electrode 31 of the diode 22 and the gate electrode 26 thereof is also similar to the above. Adopting such a structure (i.e., such a structure that the surface at which the semiconductor layer 9 makes contact with the drain electrode 31 does not overlap with the gate electrode 26 as viewed in the vertical direction of the semiconductor substrate 1) that the drain electrode 31 of the thin film transistor that configures the diode 22 does not overlap with the gate electrode 26 enables the breakdown voltage between the drain electrode 31 and the gate electrode 26 to increase.

The semiconductor device 100A according to the present embodiment in which the DC-DC converter 20A has been integrated is suitable for being applied to a SiP (system in package) device in which a plurality of LSI chips are integrated into a signal package. In the SiP device, the LSI chips different in power supply voltage (operating voltage) can be integrated into the single package. The configuration of the semiconductor device 100A of the present embodiment in which the DC-DC converter 20A has been integrated makes it easy to couple between the LSI chips different in the power supply voltage.

Figure 13:
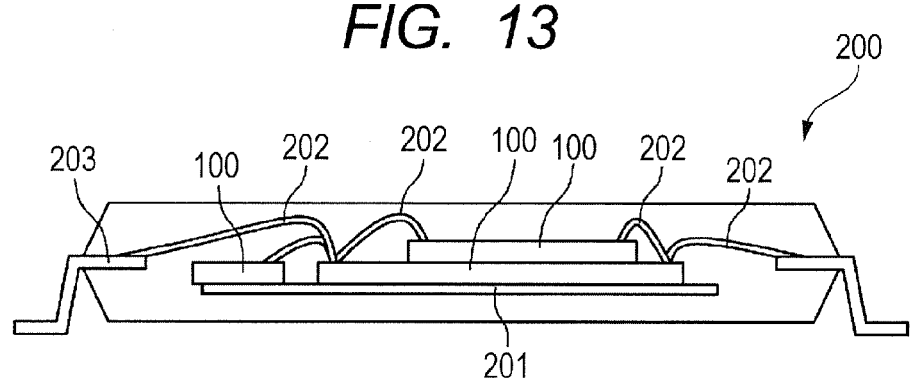
FIG. 13 is a sectional view illustrating a configuration of a SiP device in which the semiconductor devices each showing the second embodiment of the present invention are brought into integration.

FIG. 13 is a sectional view showing an example of a configuration of a SiP device 200 in which a plurality of the semiconductor devices 100A according to the present embodiment are integrated into the same package. In the SiP device 200 shown in FIG. 13, the semiconductor devices 100A of the present embodiment configured as LSI chips are mounted over a lead frame 201. Here, one semiconductor device 100A may be placed over another semiconductor device 100A. Wires 202 are used for electrical couplings between the semiconductor devices 100A and electrical couplings between the semiconductor devices 100A and leads 203. Although the electrical couplings between the LSI chips are realized using the wires 202 in the configuration shown in FIG. 13, other electrical coupling means (e.g., bumps and the like) may be used.

Figure 14A:
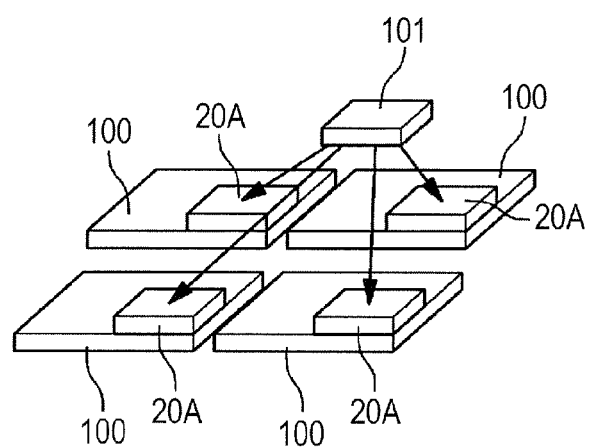
FIG. 14A is a conceptual diagram showing one example of electrical couplings in the SiP device shown in FIG. 13.
Figure 14B:
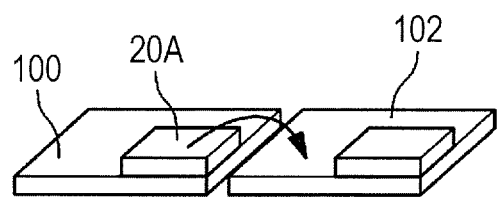
FIG. 14B is a conceptual diagram illustrating another example of electrical couplings in the SiP device shown in FIG. 13.
Figure 14C:
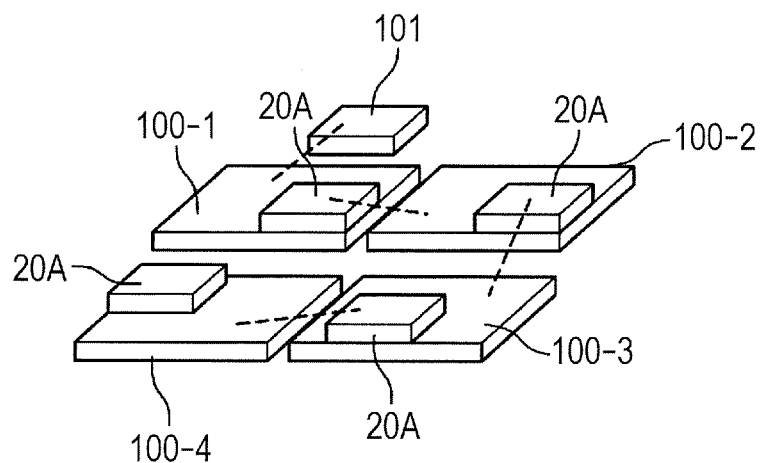
FIG. 14C is a conceptual diagram showing a further example of electrical couplings in the SiP device shown in FIG. 13.

FIGS. 14A through 14C are respectively diagrams showing examples in which the semiconductor devices 100A according to the present embodiment are applied to SiP devices 200. Any of FIGS. 14A through 14C is a conceptual diagram. Electrical couplings between LSI chips are conceptually illustrated by arrows. Incidentally, it is self-evident to the person skilled in the art that the electrical couplings between the LSI chips may be achieved by wires, bumps or other arbitrary electrical coupling means.

In the SiP device 200 shown in FIG. 14A, a plurality of semiconductor devices 100A each configured as an LSI chip are supplied with a common power supply voltage (e.g., 20V) from a power supply 101. The power supply 101 is also configured as an integrated circuit chip. A DC-DC converter 20A is mounted onto each of the semiconductor devices 100A. The DC-DC converter 20A generates a power supply voltage for operating a logic circuit of each semiconductor device 100A from the common power supply voltage received from the power supply 101. In such a configuration, a plurality of LSI chips operated at different power supply voltages can be operated by the single power supply.

In the SiP device 200 shown in FIG. 14B, a logic circuit of each of the semiconductor devices 100A of the present embodiment configured as LSI chips is supplied with a first power supply voltage (e.g., 12V). A DC-DC converter 20A of the semiconductor device 100A generates a second power supply voltage from the first power supply voltage and supplies the same to an external interface circuit of the semiconductor device 100A and an LSI chip 102. The external interface circuit of the semiconductor device 100A, and a circuit for the LSI chip 102 operate at the second power supply voltage. The transfer of signals is performed between the external interface circuit and the external interface circuit of the LSI chip 102. It is thus possible to realize the transfer of signals between the LSI chips operated at different power supply voltages.

In the SiP device 200 shown in FIG. 14C, a semiconductor device 100A-1 configured as an LSI chip is supplied with a first power supply voltage from a power supply 101, and a logic circuit of the semiconductor device 100A-1 operates at the first power supply voltage. In addition, a DC-DC converter 20A of the semiconductor device 100A-1 generates a second power supply voltage from the first power supply voltage and supplies the same to an external interface circuit of the semiconductor device 100A-1 and a semiconductor device 100A-2. The external interface circuit of the semiconductor device 100A-1 and a logic circuit of the semiconductor device 100A-2 operate at the second power supply voltage. The transfer of signals is performed between the external interface circuit and an external interface circuit of the logic circuit of the semiconductor device 100A-2. In accordance with similar forms, the semiconductor device 100A-2 and a semiconductor device 100A-3 are electrically coupled to each other, and the semiconductor device 100A-3 and a semiconductor device 100A-4 are electrically coupled to each other.

Incidentally, it is self-evident to the person skilled in the art that although Sip devices include devices of various forms such as devices each using a flip-chip coupling, the present invention is not limited to the forms of FIGS. 14A through 14C, but can generally be applied to SiP devices.

The following will present, as embodiments, experimental results showing the characteristics of the transistors 21-1 and 21-2 (first embodiment) integrated into the semiconductor layers 8-1 and 8-2 and the transistor 21 and the diode 22 (second embodiment) integrated into the semiconductor layers 8 and 9.

Embodiments

Figure 15A:
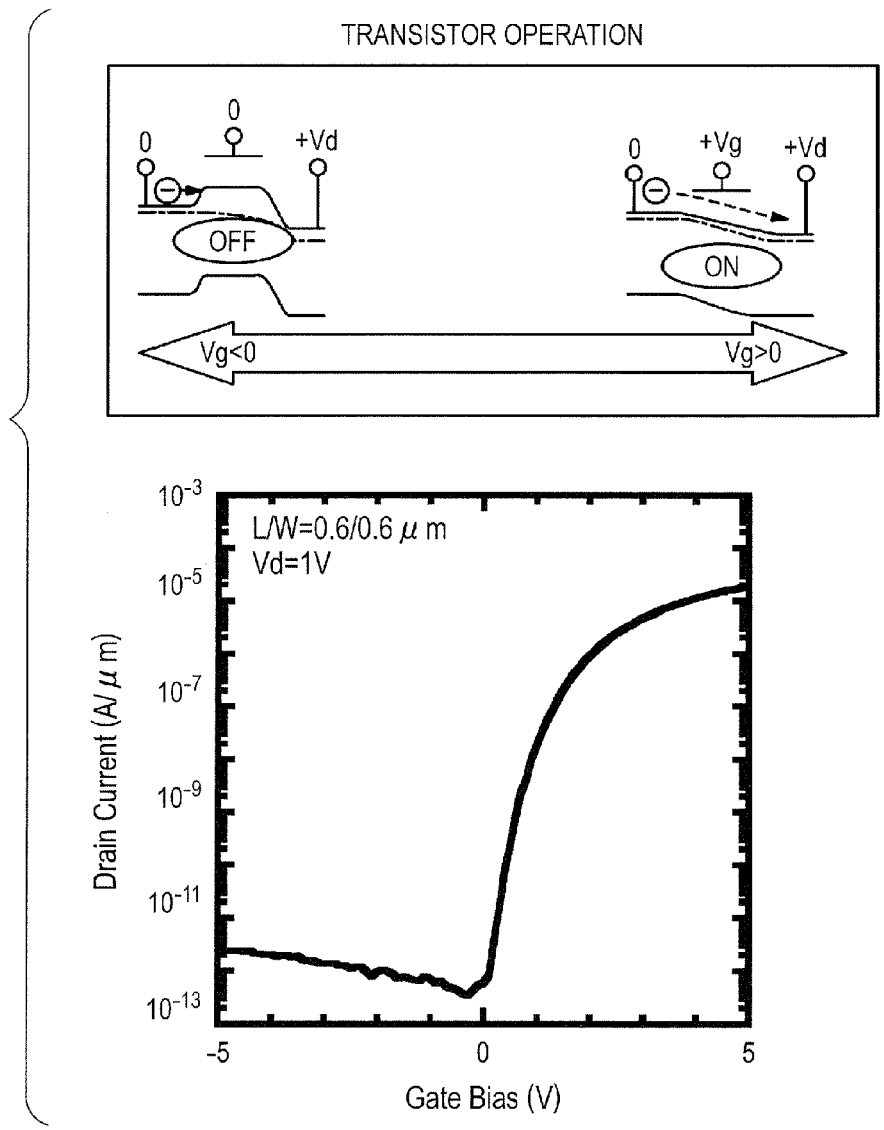
FIG. 15A is a graph showing the operating characteristics of a transistor in one embodiment of the present invention.

FIG. 15A is a graph showing an example of the characteristics of the transistors (21-1 and 21-2) integrated in the semiconductor layers (8-1 and 8) formed away from the semiconductor substrate 1. FIG. 15B is a graph showing an example of the characteristics of the diode (22) integrated into the semiconductor layer (9) formed away from the semiconductor substrate 1. In the transistor and diode measured in characteristics, the semiconductor layer is formed of IGZO, and SiN of 20 nm-thick is used as the gate insulating film (diffusion preventing layer 7-1).

As shown in FIG. 15A, when a positive voltage bias is applied to a gate electrode of the transistor while fixing a source potential (potential at a source electrode) of the transistor to 0V and fixing a drain potential Vd (potential at its drain electrode) to 1V, a drain current flow. On the other hand, when a negative voltage bias is applied thereto, the drain current is cut off. This result means that the transistor actually performs a transistor operation.

On the other hand, as shown in FIG. 15B, when a positive voltage bias is applied to a drain electrode of a diode while fixing gate and source electrodes of the diode to 0V (this means that a thin film transistor used for the diode is diode-coupled), a drain current is cut off, whereas when a negative voltage bias is applied thereto, the drain current flows. In the example of FIG. 15B, an on voltage is −0.7V. This result means that the diode actually performs a diode operation (rectifying operation). Thus, the inventors have confirmed by experiments that the transistor or diode provided in each wiring layer actually operates as the active element (transistor or diode).

As described above, one advantage of the semiconductor device according to the present embodiment resides in that the high breakdown characteristics can be achieved with respect to the circuit elements (transistors 21-1, 21-2 and 21, diode 22 and capacitor 23) used therein, and further the degree of freedom to adjust the breakdown voltage is large. The inventors et al. have measured the breakdown voltage of each circuit element actually fabricated in the wiring layer 3 and demonstrated such an advantage. Described specifically, the inventors et al. have measured a breakdown voltage between the drain and gate of an actually fabricated diode 22.

Figure 16:
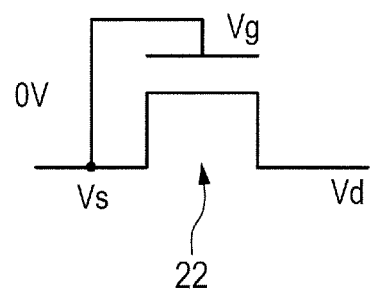
FIG. 16 is a circuit diagram illustrating couplings between terminals of a diode (i.e., a diode-coupled thin film transistor) whose breakdown voltage is measured.

Here, the structure of the diode 22 subjected to the measurement is as follows: A semiconductor layer 9 is an IGZO film of 10 nm-thick, and an SiN film ranging from 20 nm to 50 nm in thickness is used as a gate insulating film (diffusion preventing layer 7-1). A gate length L and a gate width W are both 0.6 μm. A source electrode 30 and a drain electrode 31 overlap with a gate electrode 26. Their overlap lengths $d_{OL1}$ and $d_{OL2}$ are 0.16 μm. As shown in FIG. 16, a voltage bias is applied to the drain electrode 29 in a state in which the gate electrode 26 and the source electrode 30 are couple in common and fixed to 0V. Since the diode 22 is formed of the thin film transistor in which the gate electrode 26 and the source electrode 30 are coupled in common, it is technically appropriate to measure the breakdown voltage by such coupling.

Figure 17A:
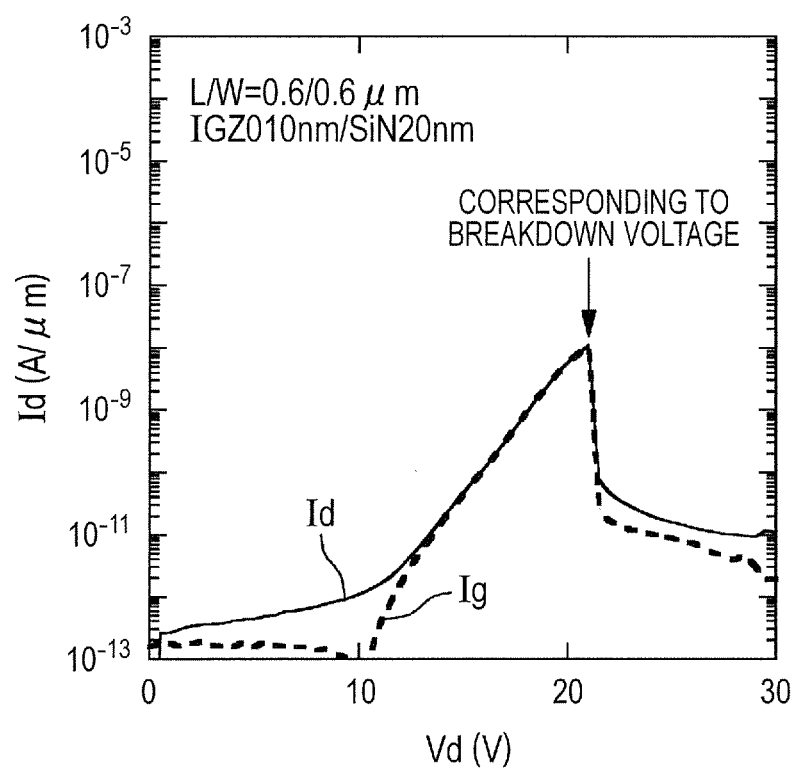
FIG. 17A is a graph showing the drain current characteristics of a diode (diode-coupled thin film transistor) containing a 20 nm-thick SiN film as a gate insulating film.

FIG. 17A is a graph showing changes in drain current Id and gate current Ig of the diode 22 when the voltage bias (drain potential Vd) applied to the drain electrode 31 is changed where the semiconductor layer 9 is of the IGZO film of 10 nm-thick and the gate insulating film (diffusion preventing film 7-1) is of the SiN film of 20 nm-thick. When the drain potential Vd is increased, the diode 22 breaks down at a given potential higher than 20V, and the drain current Id and the gate current Ig are suddenly reduced after they have suddenly increased. A breakdown mode indicates the breakdown of the gate insulating film. That is, such a measurement means that the gate-to-drain breakdown voltage of the diode 22 can be measured, and the source-to-drain breakdown voltage is higher than the measured gate-to-drain breakdown voltage.

Figure 17B:
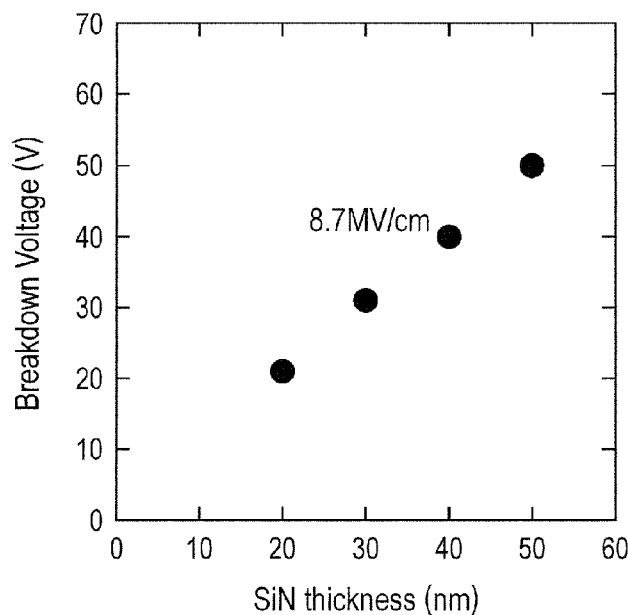
FIG. 17B is a graph showing the relationship between the thickness of the SiN film used as the gate insulating film and a gate-to-drain breakdown voltage.

FIG. 17B is a graph showing the relationship between the breakdown voltage of the diode 22 measured in this way and the thickness of the SiN film used as the gate insulating film. Setting the thickness of the SiN film to 20 nm makes it possible to realize a gate-to-drain breakdown voltage of 20V or higher. Further, the gate-to-drain breakdown voltage can be increased to 50V by increasing the thickness of the SiN film to 50 nm. Thus, the diode 22 employed in the present embodiment is capable of achieving its high breakdown characteristics and is large in the degree of freedom to adjust the breakdown voltage. Incidentally, although the breakdown voltage of the diode 22 can be increased by making the thickness of the SiN film thicker, the current flowing through the diode 22 is reduced when the thickness of the SiN film is made excessively thick. Therefore, the thickness of the SiN film may preferably be less than or equal to 100 nm.

Figure 18A:
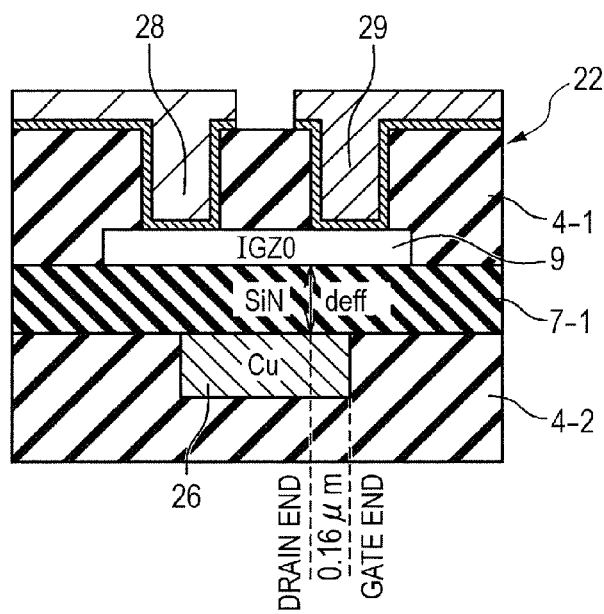
FIG. 18A is a sectional view depicting a structure of a diode of measured diodes, in which drain and gate electrodes thereof overlap each other.
Figure 18B:
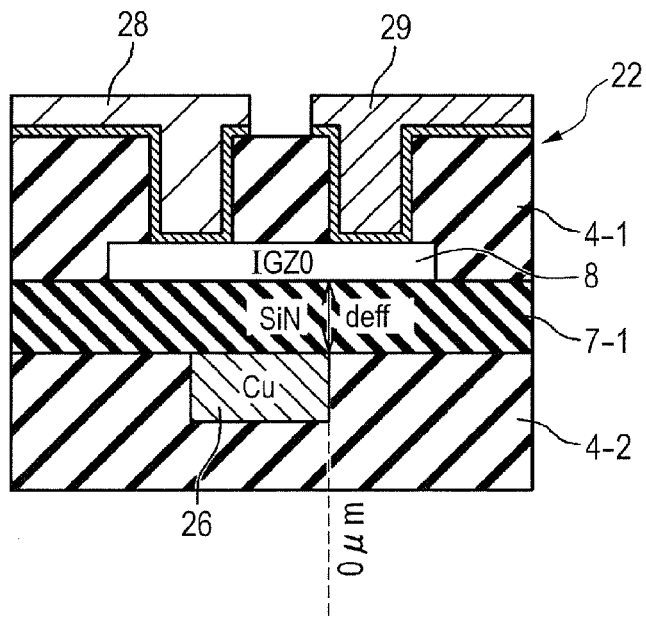
FIG. 18B is a sectional view illustrating a structure of a diode of the measured diodes, in which in a planar structure, the position of an end of a drain electrode thereof coincides with the position of an end of a gate electrode thereof.
Figure 18C:
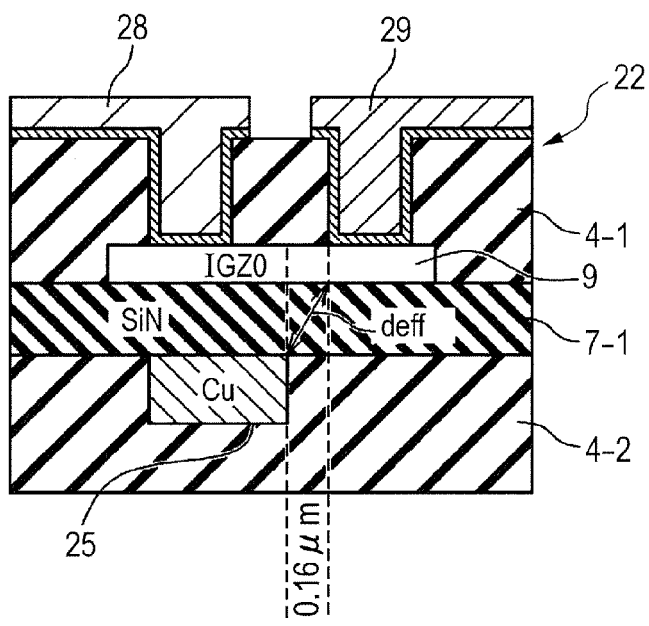
FIG. 18C is a sectional view showing a structure of a diode of the measured diodes, in which a drain electrode thereof does not overlap with a gate electrode thereof.

The gate-to-drain breakdown voltage can be increased even by spacing the gate electrode 26 and the drain electrode 31 away from each other in the in-plane direction of the semiconductor layer 9 (i.e., by preventing the drain electrode 31 from overlapping with the gate electrode 26). The inventors have demonstrated this by measuring the characteristics of the actually fabricated diode 22. FIGS. 18A through 18C are respectively sectional views each showing a structure of a fabricated diode 22.

In the structure of FIG. 18A, a drain electrode 31 overlaps with a gate electrode 26. In the structure of FIG. 18B, the end of a drain electrode 31 and the end of a gate electrode 26 are coincident in position with each other as viewed in the in-plane direction. In the structure of FIG. 18C, a drain electrode 31 does not overlap with a gate electrode 26. Incidentally, as to the structure (FIG. 18C) in which a drain electrode 31 does not overlap with a gate electrode 26, the distance from the drain electrode 31 to the gate electrode 26 in the in-plane direction is defined as an overlap length that is a negative value. As with the cases of FIGS. 17A and 17B, a semiconductor layer 9 is a 10 nm-thick IGZO film, and an SiN film that ranges from 20 nm to 50 nm in thickness is used as a gate insulating film (diffusion preventing layer 7-1). Both a gate length L and a gate width W are 0.6 μm.

Figure 19A:
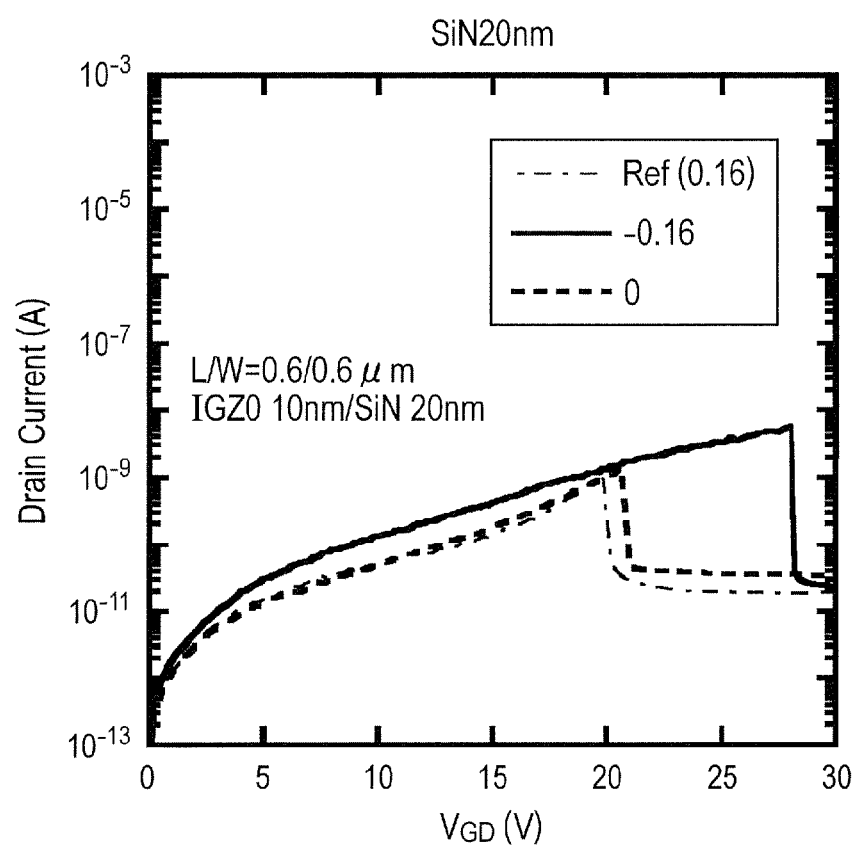
FIG. 19A is a graph illustrating the drain current characteristics of a diode (diode-coupled thin film transistor) which contains a 20 nm-thick SiN film as a gate insulating film and whose overlap length is given as 0.16 μm, 0.0 μm and −0.16 μm.
Figure 19B:
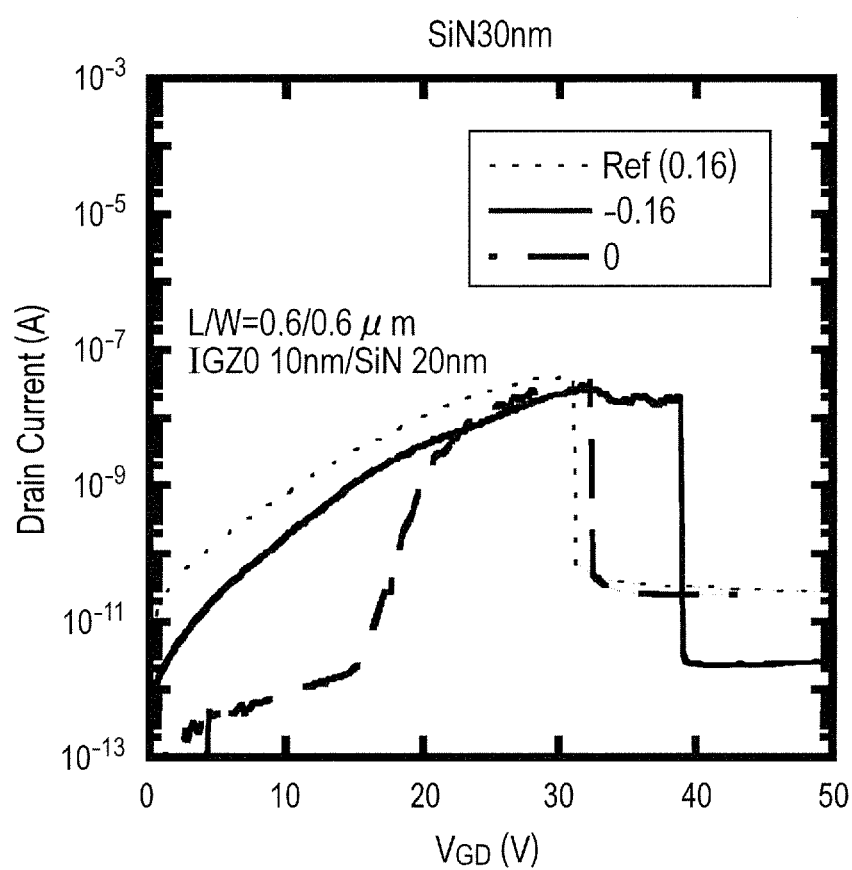
FIG. 19B is a graph showing the drain current characteristics of a diode which contains a 30 nm-thick SiN film as a gate insulating film and whose overlap length is given as 0.16 μm, 0.0 μm and −0.16 μm.
Figure 19C:
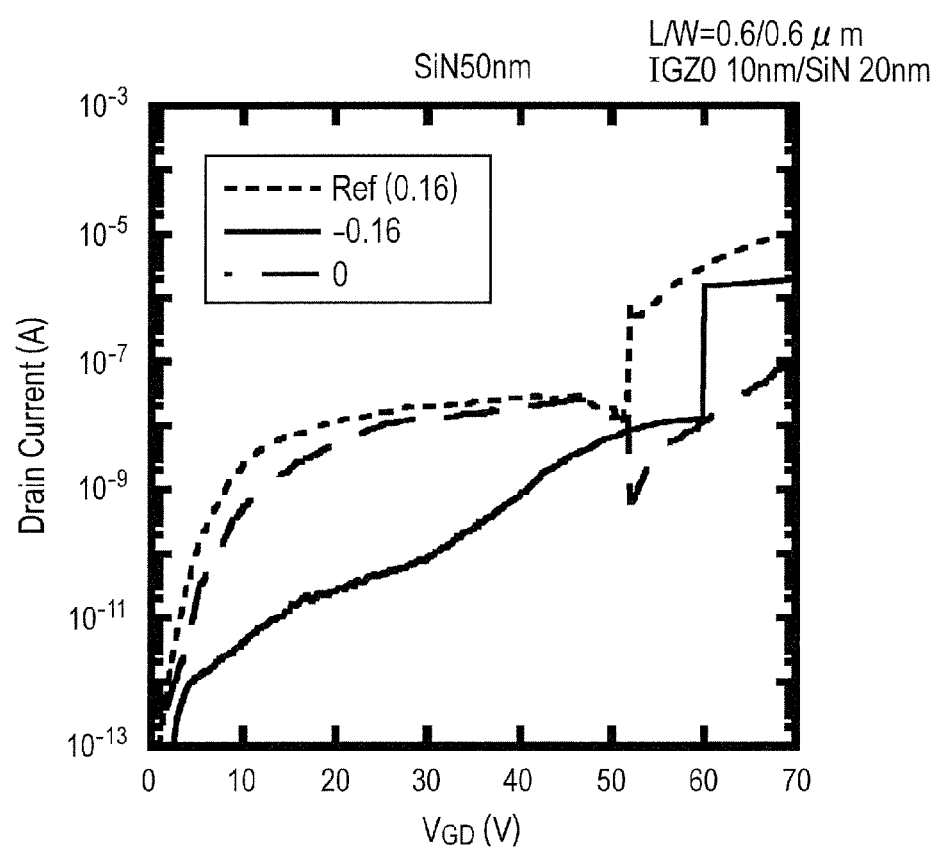
FIG. 19C is a graph showing the drain current characteristics of a diode which contains a 50 nm-thick SiN film as a gate insulating film and whose overlap length is given as 0.16 μm, 0.0 μm and −0.16 μm.

FIGS. 19A, 19B and 19C are respectively graphs of drain current characteristics where the thickness of the SiN film is 20 nm, 30 nm and 50 nm respectively. Dash-dotted lines indicate drain currents where the overlap length is 0.16 μm, broken lines indicate drain currents where the overlap length is 0.0 μm, and solid lines indicate drain currents where the overlap length is −0.16 μm (i.e., the case with no overlap), respectively. In the graphs of the drain current characteristics, the gate-to-drain voltage $V_{GD}$ at which the drain current changes suddenly indicates a gate-to-drain breakdown voltage.

Figure 20:
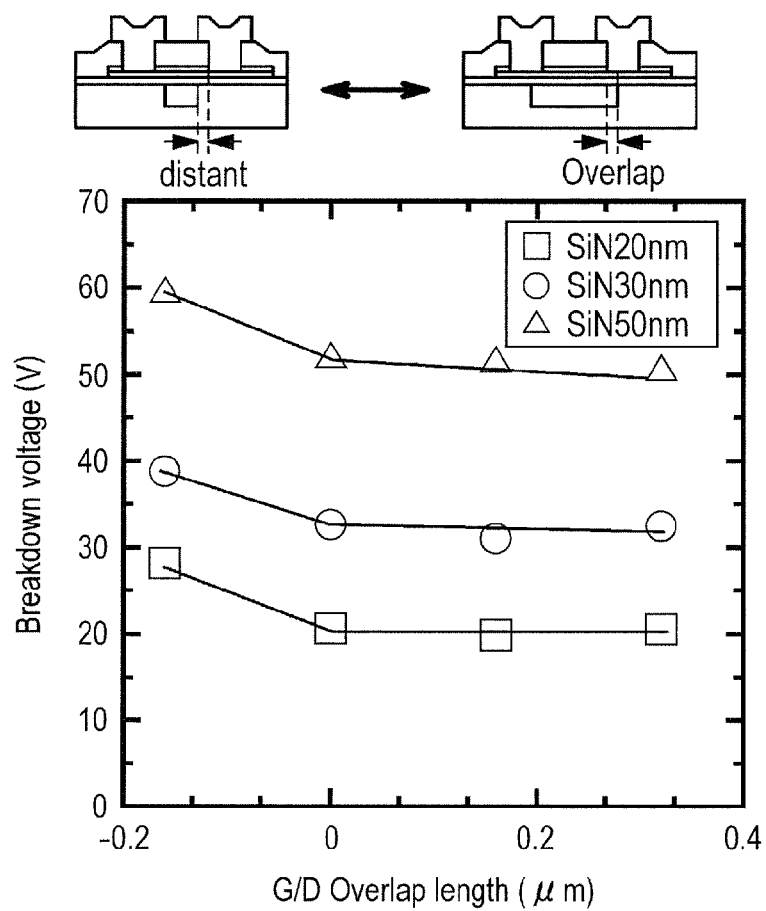
FIG. 20 is a graph showing the relationship between overlap lengths of the diodes shown in FIGS. 18A through 18C and their gate-to-drain breakdown voltages.

FIG. 20 is a graph showing the relationship between the overlap length of the drain electrode 31 relative to the gate electrode 26, and the breakdown voltage between the gate and drain. As is understood from FIG. 16, the gate-to-drain breakdown voltage does not depend on the overlap length in the structure in which the drain electrode 31 overlaps with the gate electrode 26 and the structure in which the end of the drain electrode 31 and the end of the gate electrode 26 are coincident in position with each other as viewed in the in-plane direction. This is considered to occur due to the fact that the distance $d_{eff}$ (defined at the shortest position) between the drain electrode 31 and the gate electrode 26 is the same as the thickness of the diffusion preventing layer 7-1. On the other hand, when the drain electrode 31 does not overlap with the gate electrode 26, the distance $d_{eff}$ between the drain electrode 31 and the gate electrode 26 increases. An increase in the gate-to-drain breakdown voltage is considered to arise from an increase in the distance $d_{eff}$.

It is self-evident to the person skilled in the art that although the drain-to-gate breakdown voltage of the thin film transistor used as the diode 22 has been discussed in the above embodiments, the same discussion is established with respect to the drain-to-gate breakdown voltages of the transistors 21-1, 21-2 (first embodiment) and the transistor 21 (second embodiment), and their source-to-gate breakdown voltages.

Figure 21A:
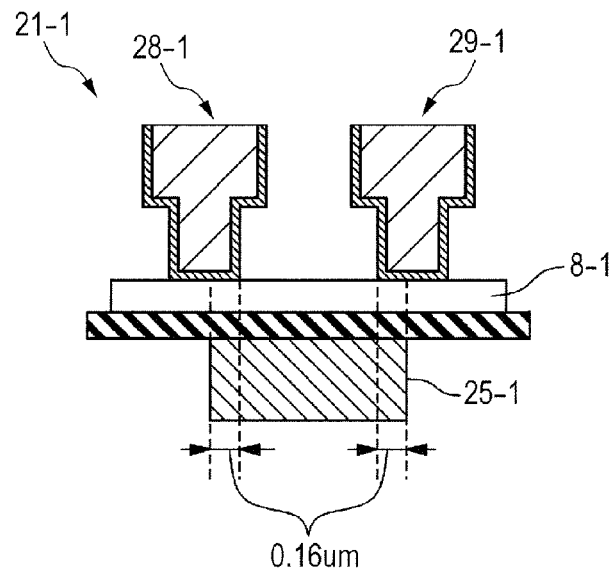
FIG. 21A is a sectional view showing a configuration of a transistor in which the evaluation of effects of hot carrier injection by the application of a high drain voltage is carried out.
Figure 21B:
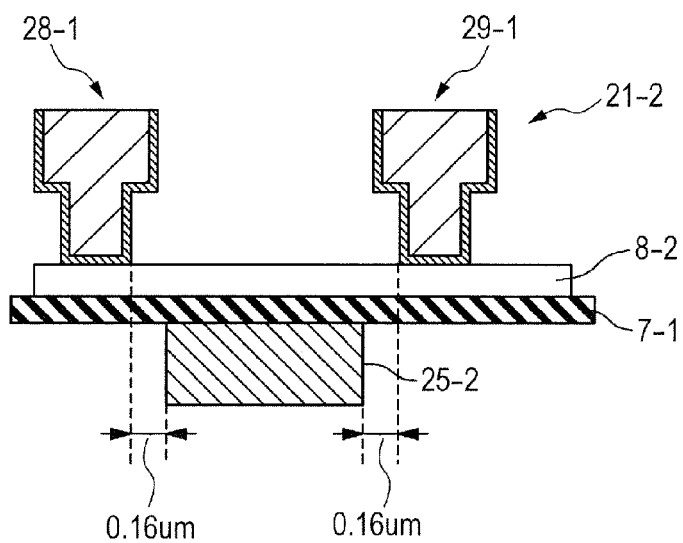
FIG. 21B is a sectional view illustrating a configuration of a transistor in which the evaluation of effects of hot carrier injection by the application of a high drain voltage is carried out.

Further, the inventors have confirmed by experiments that the effects of hot carrier injection where a high drain voltage is applied can be reduced by spacing the gate electrode and the drain electrode away from each other in the in-plane direction (i.e., preventing the drain electrode from overlapping with the gate electrode). More specifically, the inventors have evaluated the characteristics of transistors 21-1 and 21-2 having such structures as shown in FIGS. 21A and 21B. Here, in the transistor 21-1 shown in FIG. 21A, a 10 nm-thick IGZO film is used as a semiconductor layer 8-1, and a 30 nm-thick SiN film is used as a gate insulating film (diffusion preventing layer 7-1). A gate length L and a gate width W are both 0.6 μm. Further, both of a source electrode 28-1 and a drain electrode 29-1 overlap with a gate electrode 25-1. An overlap length is 0.16 μm with respect to both the source electrode 28-1 and the drain electrode 29-1. On the other hand, in the transistor 21-2 of FIG. 21B, both of a source electrode 28-1 and a drain electrode 29-1 are spaced away from a gate electrode 25-1 in the in-plane direction. An overlap length is −0.16 μm with respect to both of the source electrode 28-2 and the drain electrode 29-2. The transistor 21-2 of FIG. 21B is identical in other structure to the transistor 21-1 of FIG. 21A.

Figure 22:
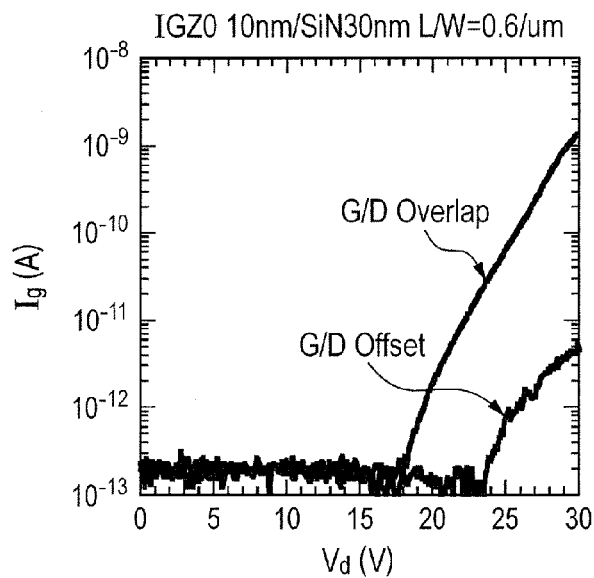
FIG. 22 is a graph showing the drain voltage vs gate current characteristics of the transistors shown in FIGS. 21A and 21B.

FIG. 22 is a graph showing drain voltage vs gate current characteristics of the transistor 21-1 of FIG. 21A and the transistor 21-2 of FIG. 21B. Upon the measurement of the drain voltage vs gate current characteristics, a gate voltage Vg is se to 3.3V. In FIG. 22, "G/D Overlap" indicates the drain voltage vs gate current characteristics of the transistor 21-1 of FIG. 21A, and "G/D Offset" indicates the drain voltage vs gate current characteristics of the transistor 21-2 of FIG. 21B. It is found that as is understood from FIG. 22, the transistor 21-2 having adopted the structure in which the source electrode and the drain electrode are spaced away from the gate electrode has improved the voltage at which a gate leak starts to increase, from 17V to 24V, and can suppress an increase in gate leak at the time that a high drain voltage Vd is applied, as compared with the transistor 21-1 having adopted such a structure as to cause overlapping. This is considered to occur due to the fact that the injection of hot carriers from the drain to the gate, which are generated when the transistor operates at a high drain voltage Vd, has been suppressed.

Figure 23:
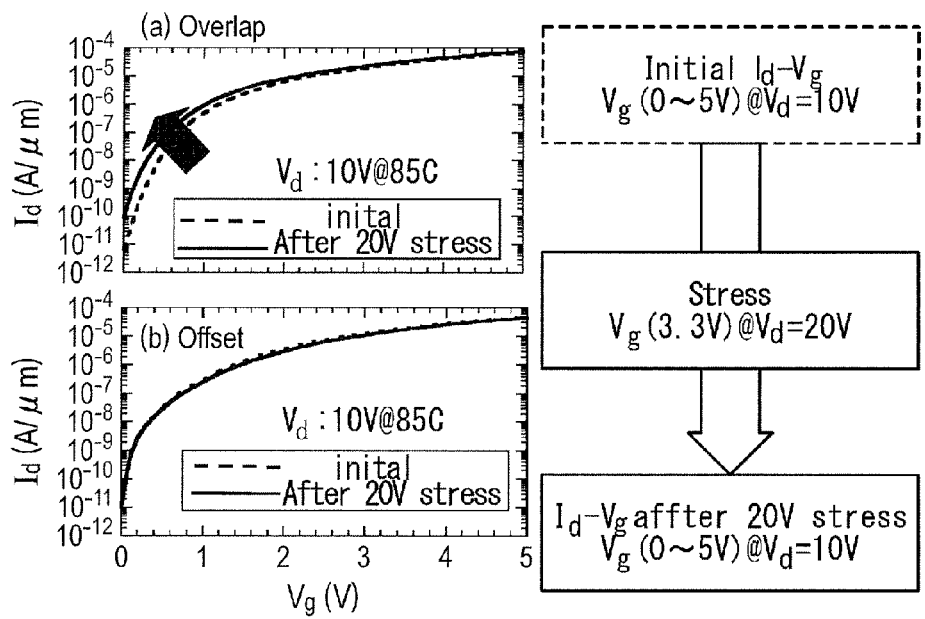
FIG. 23 is a graph illustrating changes in the gate voltage vs gate current characteristics before and after the application of stress to the transistors shown in FIGS. 21A and 21B.

On the other hand, FIG. 23 is a graph in which changes in gate voltage vs drain current characteristics where a high stress voltage is applied to the drains of the transistor 21-1 of FIG. 21A and the transistor 21-2 of FIG. 21B have been measured with respect to the transistors 21-1 and 21-2. "(a) Overlap" of FIG. 23 indicates the gate voltage vs drain current characteristics of the transistor 21-1 having adopted the structure in which the source and drain electrodes are caused to overlap with the gate electrode. "(b) Offset" of FIG. 23 indicates the gate voltage vs drain current characteristics of the transistor 21-2 having adopted the structure in which the source and drain electrodes are not caused to overlap with the gate electrode.

Upon a series of measurements, the gate voltage Vg was first swept from 0V to 5V in a state in which a drain voltage Vd of 10V was being applied. The gate voltage vs drain current characteristics in an initial state were measured. Thereafter, the drain voltage Vd was swept from 0V to 20V in a state in which a gate voltage Vg of 3.3V was being applied. Thus, a high stress voltage is applied to the drain. Subsequently, the gate voltage Vg was swept from 0V to 5V again in a state in which the drain voltage Vd of 10V was being applied, so that the gate voltage vs drain current characteristics were measured again.

As is understood from FIG. 23, the transistor 21-1 having adopted the structure in which the source and drain electrodes overlap with the gate electrode, causes a shift in its threshold voltage in a negative direction after the application of a high drain voltage Vd. On the other hand, the transistor 21-1 having adopted the structure in which the source and drain electrodes are spaced away from the gate electrode, suppresses a change in its threshold voltage. This is considered to occur due to the fact that the injection of hot carriers at the application of the high drain voltage Vd is suppressed by adopting the structure in which the source and drain electrodes are spaced away from the gate electrode.

These results of measurement indicate that a stable operation at the application of the high drain voltage can be obtained by using the structure in which the source and drain electrodes are spaced away from the gate electrode, when a high voltage operation is required.

Although the embodiments of the present invention have been described specifically above, the present invention is not limited to the above embodiments. The present invention can be carried out after various changes self-evident to the person skilled in the art have been made. Although the configurations in which the semiconductor layers 8-1, 8-2, 8 and 9 are respectively provided in the wiring layers 3-1 located at the top have been disclosed in FIGS. 2 and 7 in particular, the semiconductor layers 8-1, 8-2, 8 and 9 may be provided in an arbitrary wiring layer 3 if they are spaced away from the semiconductor substrate 1.

Although the second embodiment (FIGS. 6 and 7 in particular) has shown the configuration in which the transistor 21, the diode 22, the capacitor 23 and the inductor 24 that configure the DC-DC converter 20A have been provided in the same wiring layer 3, one circuit element of the transistor 21, the diode 22, the capacitor 23 and the indictor 24 may be provided in the wiring layer 3 different from that for the other circuit elements. For example, the semiconductor layer 8 formed with the transistor 21, and the semiconductor layer 9 formed with the diode 22 may be provided in different wiring layers 3. The configuration in which the transistor 21, the diode 22, the capacitor 23 and the inductor 24 are provided in the same wiring layer 3 is however preferred in that the number of process steps for forming the transistor 21, the diode 22, the capacitor 23 and the inductor 24 can be reduced as compared with the configuration in which they are provided in the different wiring layers 3. Further, although the diode 22 and the capacitor 23 are formed using the same semiconductor layer 9 in the above embodiment, the capacitor 23 may be formed using a semiconductor layer separated from the semiconductor layer 9. Even in this case, the semiconductor layer used in the capacitor 23 is preferably formed (formed over the diffusion preventing layer 7-1 in each of the structures shown in FIGS. 6 and 7, for example) in the same wiring layer 3 as the semiconductor layer 9 that configure the diode 22.

What is claimed is:

1. A semiconductor device comprising:
   a logic circuit; and
   an active element circuit operating as a DC-DC converter which generates a second power supply voltage from a first power supply voltage;
   wherein the logic circuit includes a first active element formed in a semiconductor substrate, and wirings provided in each of wiring layers located above the semiconductor substrate,
   wherein the active element circuit includes a second active element formed using a first semiconductor layer formed over a first insulating film formed above the wiring layer, and
   wherein the active element circuit is controlled by the logic circuit.

2. The semiconductor device according to claim 1, wherein the active element circuit is controlled through wirings that configure the logic circuit.

3. The semiconductor device according to claim 2, further comprising:
   a second insulating film formed above the semiconductor substrate;
   a plurality of wirings embedded in trenches provided in the second insulating film;
   a first source electrode coupled to the first semiconductor layer; and
   a first drain electrode coupled to the first semiconductor layer,
   wherein the first insulating film is provided so as to cover the second insulating film and the wirings,
   wherein the wirings include a first gate electrode provided at a position opposite to the first semiconductor layer, and
   wherein the first semiconductor layer, the first source electrode, the first drain electrode and the first gate electrode function as the second active element that configures the active element circuit.

4. The semiconductor device according to claim 3, wherein a surface at which the first drain electrode contacts the first semiconductor layer does not overlap with the first gate electrode in the direction perpendicular to the semiconductor substrate.

5. The semiconductor device according to claim 3, wherein a surface at which the first source electrode contacts the first semiconductor layer does not overlap with the first gate electrode in the direction perpendicular to the semiconductor substrate.

6. The semiconductor device according to claim 3, wherein surfaces at which both of the first source electrode and the first drain electrode contact the first semiconductor layer do not overlap with the first gate electrode in the direction perpendicular to the semiconductor substrate.

7. The semiconductor device according to claim 1, wherein the first semiconductor layer is comprised of a semiconductor having a bandgap wider than a bandgap of silicon.

8. The semiconductor device according to claim 1, wherein the first semiconductor layer is comprised of either InGaZnO, InZnO, ZnO, ZnAlO or ZnCuO.

9. The semiconductor device according to claim 3, further comprising:
   a second semiconductor layer formed over the first insulating film;
   a second source electrode coupled to the first semiconductor layer; and
   a second drain electrode coupled to the first semiconductor layer,
   wherein the wirings further include a second gate electrode provided at a position opposite to the second semiconductor layer,
   wherein the second gate electrode and the second source electrode are electrically coupled to each other,
   wherein the first semiconductor layer, the first source electrode, the first drain electrode and the first gate electrode function as a transistor that configures the DC-DC converter, and
   wherein the second semiconductor layer, the second source electrode, the second drain electrode and the second gate electrode function as a diode that configures the DC-DC converter.

10. The semiconductor device according to claim 9,
    wherein the wirings further include a capacitor electrode provided so as to be opposite to a third semiconductor layer formed over the second semiconductor layer or the first insulating film, and
    wherein the capacitor electrode functions as a capacitor that configures the DC-DC converter.

11. The semiconductor device according to claim 9, wherein the wirings further include a wiring which functions as an inductor that configures the DC-DC converter.

12. The semiconductor device according to claim 3, wherein a breakdown voltage between the first gate electrode and the first drain electrode is greater than or equal to 20V.

13. The semiconductor device according to claim 3, wherein a breakdown voltage between the first gate electrode and the first source electrode is greater than or equal to 20V.

14. The semiconductor device according to claim 12, wherein the first insulating film is a SiN film.

15. The semiconductor device according to claim 7, wherein the thickness of the first insulating film ranges from greater than or equal to 10 nm to less than or equal to 20 nm.

16. A SiP device comprising:
    a plurality of integrated circuit chips integrated into the same package,
    wherein at least one of the integrated circuit chips is configured as the semiconductor device according to claim 1.

17. A SiP device comprising:
    a plurality of integrated circuit chips integrated into the same package; and a power supply which supplies the first power supply voltage to the integrated circuit chips respectively, wherein each of the integrated circuit chips is configured as the semiconductor device according to claim 1, and wherein each of the DC-DC converters respectively included in the integrated circuit chips generates a second power supply voltage from the first power supply voltage and supplies the same to the logic circuit of each of the integrated circuit chips.

18. A SiP device comprising:

a plurality of integrated circuit chips integrated into the same package, wherein each of the integrated circuit chips includes a first integrate circuit chip configured as the semiconductor device according to claim 1, wherein the logic circuit of the first integrated circuit chip operates at the first power supply voltage, and wherein the DC-DC converter of the first integrated circuit chip supplies the second power supply voltage to a second integrated circuit chip of the integrated circuit chips.

19. A SiP device comprising:

a plurality of integrated circuit chips integrated into the same package; and a power supply, wherein each of the integrated circuit chips includes a first integrated circuit chip configured as the semiconductor device according to claim 1, wherein the power supply supplies the first power supply voltage to the first integrated circuit chip, wherein the logic circuit of the first integrated circuit chip operates at the first power supply voltage, and wherein the DC-DC converter of the first integrated circuit chip supplies the second power supply voltage to a second integrated circuit chip of the integrated circuit chips.

* * * * *